(12) United States Patent
Hadland

(10) Patent No.: US 9,941,090 B2
(45) Date of Patent: Apr. 10, 2018

(54) X-RAY SOURCE, HIGH-VOLTAGE GENERATOR, ELECTRON BEAM GUN, ROTARY TARGET ASSEMBLY, AND ROTARY VACUUM SEAL

(71) Applicant: NIKON METROLOGY NV, Leuven (BE)

(72) Inventor: Roger Hadland, Chipperfield (GB)

(73) Assignee: NIKON METROLOGY NV, Leuven (BE)

( * ) Notice: Subject to any disclaimer, the term of this patent is extended or adjusted under 35 U.S.C. 154(b) by 0 days.

(21) Appl. No.: 15/717,402

(22) Filed: Sep. 27, 2017

(65) Prior Publication Data
US 2018/0033582 A1 Feb. 1, 2018

Related U.S. Application Data

(62) Division of application No. 14/774,424, filed as application No. PCT/EP2014/054837 on Mar. 12, 2014.
(Continued)

(30) Foreign Application Priority Data

Mar. 15, 2013 (GB) .................................. 1304870.7

(51) Int. Cl.
*H01J 35/10* (2006.01)
*H01J 35/02* (2006.01)
(Continued)

(52) U.S. Cl.
CPC .......... *H01J 35/025* (2013.01); *F16C 33/768* (2013.01); *F16C 35/042* (2013.01);
(Continued)

(58) Field of Classification Search
CPC ............. H01J 35/106; H01J 2235/1204; H01J 2235/1262; H01J 2235/1266
See application file for complete search history.

(56) References Cited

U.S. PATENT DOCUMENTS

| 2,488,200 A | 11/1949 | Gustaf et al. |
| 3,038,731 A | 6/1962 | Milleron |

(Continued)

FOREIGN PATENT DOCUMENTS

| BE | 1013646 | 5/2002 |
| DE | 976500 | 10/1963 |

(Continued)

OTHER PUBLICATIONS

Adler et al., "The Nested High Voltage Generator for Pulsed Power", North Star Research Corporation, 9931 Lomas, NE, Albuquerque, NM, 87112, IEEE, 1992, 4 pages.
(Continued)

*Primary Examiner* — Thomas R Artman
(74) *Attorney, Agent, or Firm* — Andrew M. Calderon; Roberts Mlotkowski Safran Cole & Calderon, P.C.

(57) ABSTRACT

Disclosed herein are a high-voltage generator for an x-ray source, an x-ray gun, an electron beam apparatus, a rotary vacuum seal, a target assembly for an x-ray source, a rotary x-ray emission target, and an x-ray source. These various aspects may separately and/or together enable the construction of an x-ray source which can operate at energies of up to 500 kV and beyond, which is suitable for use in commercial and research x-ray applications such as computerised tomography. In particular, the high-voltage generator includes a shield electrode electrically connected intermediate of a first voltage multiplier and a second voltage multiplier. The electron beam apparatus includes control photodetectors and photo emitters having a transparent conductive shield arranged therebetween. The rotary
(Continued)

vacuum seal includes a pumpable chamber at a position intermediate between high-pressure and low-pressure ends of a bore for a rotating shaft. The rotary target assembly is configured such that when a torque between a bearing housing and a vacuum housing exceeds a predetermined torque, the bearing housing rotates relative to the vacuum housing. The rotary x-ray emission target has a plurality of target plates supported on a hub, the plates being arranged on the hub to provide an annular target region about an axis rotation of the hub. The x-ray gun is provided with a shield electrode maintained at a potential difference relative to the x-ray target different to the electron beam emission cathode.

19 Claims, 12 Drawing Sheets

Related U.S. Application Data

(60) Provisional application No. 61/787,930, filed on Mar. 15, 2013.

(51) Int. Cl.

| | | |
|---|---|---|
| *H01J 35/16* | (2006.01) | |
| *F16J 15/16* | (2006.01) | |
| *H01J 29/48* | (2006.01) | |
| *F16C 35/04* | (2006.01) | |
| *F16C 33/76* | (2006.01) | |
| *H02M 1/32* | (2007.01) | |
| *H05G 1/12* | (2006.01) | |
| *H02M 7/10* | (2006.01) | |
| *H01J 35/04* | (2006.01) | |

(52) U.S. Cl.
CPC ............... *F16J 15/16* (2013.01); *H01J 29/48* (2013.01); *H01J 35/04* (2013.01); *H01J 35/101* (2013.01); *H01J 35/106* (2013.01); *H01J 35/108* (2013.01); *H01J 35/16* (2013.01); *H02M 1/32* (2013.01); *H02M 7/106* (2013.01); *H05G 1/12* (2013.01); *H01J 2235/0236* (2013.01); *H01J 2235/083* (2013.01); *H01J 2235/086* (2013.01); *H01J 2235/087* (2013.01); *H01J 2235/1046* (2013.01); *H01J 2235/1204* (2013.01); *H01J 2235/1262* (2013.01); *H01J 2235/20* (2013.01)

(56) References Cited

U.S. PATENT DOCUMENTS

| | | | |
|---|---|---|---|
| 3,356,844 A | 12/1967 | Houbart | |
| 3,601,656 A | 8/1971 | Smith et al. | |
| 3,819,968 A | 6/1974 | Haberrecker et al. | |
| 3,836,804 A * | 9/1974 | Frens | H01J 35/10 378/125 |
| 3,870,915 A | 3/1975 | Eckart et al. | |
| 3,925,660 A | 12/1975 | Albert | |
| 3,934,164 A | 1/1976 | Braun et al. | |
| 3,983,397 A | 9/1976 | Albert | |
| 4,048,496 A | 9/1977 | Albert | |
| 4,103,198 A * | 7/1978 | Braun | H01J 35/10 378/125 |
| 4,130,772 A * | 12/1978 | Kussel | H01J 35/106 378/130 |
| 4,210,371 A | 7/1980 | Gerkema et al. | |
| 4,250,425 A | 2/1981 | Gabbay et al. | |
| 4,260,885 A | 4/1981 | Albert | |
| 4,357,537 A | 11/1982 | Rattner | |
| 4,405,876 A | 9/1983 | Iversen | |
| 4,622,687 A * | 11/1986 | Whitaker | H01J 35/106 313/30 |
| 4,625,324 A * | 11/1986 | Blaskis | H01J 35/16 313/22 |
| 4,658,414 A | 4/1987 | Geldner | |
| 4,811,375 A | 3/1989 | Klostermann | |
| 5,018,181 A * | 5/1991 | Iversen | H01J 35/106 378/130 |
| 5,077,781 A * | 12/1991 | Iversen | H01J 35/106 378/132 |
| 5,124,658 A | 6/1992 | Adler | |
| 5,325,284 A | 6/1994 | Stephenson | |
| 5,680,431 A | 10/1997 | Pietras, III et al. | |
| 6,154,382 A | 11/2000 | Kawahara et al. | |
| 6,487,275 B1 | 11/2002 | Noboru et al. | |
| 6,546,079 B2 | 4/2003 | Fritsch | |
| 6,560,315 B1 | 5/2003 | Price et al. | |
| 6,983,035 B2 | 1/2006 | Price et al. | |
| 7,180,981 B2 | 2/2007 | Wang | |
| 7,197,116 B2 | 3/2007 | Dunham et al. | |
| 7,440,549 B2 * | 10/2008 | Kerpershoek | H01J 35/106 378/125 |
| 7,746,982 B2 * | 6/2010 | Yoshii | H01J 35/101 378/132 |
| 7,787,595 B2 | 8/2010 | Fritzler et al. | |
| 7,809,113 B2 | 10/2010 | Aoki et al. | |
| 7,978,824 B2 * | 7/2011 | Motz | H01J 35/08 378/121 |
| 8,295,441 B2 | 10/2012 | Beyerlein et al. | |
| 8,558,486 B2 | 10/2013 | Smick et al. | |
| 8,953,746 B2 * | 2/2015 | Roshi | H01J 35/06 378/125 |
| 9,208,988 B2 | 12/2015 | Morton et al. | |
| 9,263,229 B2 | 2/2016 | Arbouet et al. | |
| 2002/0021783 A1 | 2/2002 | Fritsch | |
| 2002/0047545 A1 | 4/2002 | Paulus et al. | |
| 2002/0141538 A1 | 10/2002 | Nakamuta et al. | |
| 2002/0150212 A1 | 10/2002 | Ratzmann et al. | |
| 2003/0147498 A1 | 8/2003 | Hadland et al. | |
| 2005/0063514 A1 | 3/2005 | Price et al. | |
| 2005/0123097 A1 | 6/2005 | Wang et al. | |
| 2007/0041504 A1 | 2/2007 | Hockersmith et al. | |
| 2007/0297570 A1* | 12/2007 | Kerpershoek | H01J 35/106 378/130 |
| 2008/0069306 A1* | 3/2008 | Hockersmith | H01J 35/10 378/143 |
| 2008/0084966 A1 | 4/2008 | Aoki et al. | |
| 2009/0010393 A1 | 1/2009 | Klinkowstein et al. | |
| 2009/0060137 A1 | 3/2009 | Fritzler et al. | |
| 2009/0080616 A1* | 3/2009 | Yoshii | H01J 35/101 378/133 |
| 2010/0111260 A1* | 5/2010 | Motz | H01J 35/08 378/144 |
| 2010/0226479 A1 | 9/2010 | Beyerlein et al. | |
| 2010/0327190 A1 | 12/2010 | Glavish et al. | |
| 2011/0188625 A1* | 8/2011 | Roshi | H01J 35/06 378/4 |
| 2012/0128117 A2* | 5/2012 | Roshi | H01J 35/06 378/4 |
| 2012/0146554 A1 | 6/2012 | Smick et al. | |
| 2015/0008323 A1 | 1/2015 | Arbouet et al. | |
| 2016/0020058 A1* | 1/2016 | Hadland | H01J 35/025 378/111 |

FOREIGN PATENT DOCUMENTS

| | | |
|---|---|---|
| DE | 976500 C | 10/1963 |
| DE | 1245613 | 7/1967 |
| DE | 1614368 | 7/1970 |
| DE | 2203645 | 8/1973 |
| DE | 2724732 | 12/1978 |
| DE | 102008033770 | 1/2010 |
| EP | 2249629 | 11/2010 |
| FR | 902237 | 8/1945 |
| FR | 906160 A | 12/1945 |
| GB | 242946 | 1/1926 |
| GB | 839945 | 6/1960 |
| GB | 1158151 | 7/1969 |
| GB | 1384023 | 2/1974 |
| JP | S4912783 | 2/1974 |

(56) References Cited

FOREIGN PATENT DOCUMENTS

| | | |
|---|---|---|
| JP | S53116091 | 10/1978 |
| JP | S54149594 | 11/1979 |
| JP | S5641658 | 4/1981 |
| JP | S5725660 | 2/1982 |
| JP | S585950 | 1/1983 |
| JP | S5814499 B2 | 1/1983 |
| JP | S58133300 U | 9/1983 |
| JP | S60262338 | 12/1985 |
| JP | S61206141 | 9/1986 |
| JP | S62143352 A | 6/1987 |
| JP | S6410554 | 1/1989 |
| JP | S6417000 | 1/1989 |
| JP | H01209641 | 8/1989 |
| JP | H0340348 | 2/1991 |
| JP | H0541191 | 2/1993 |
| JP | H11219677 | 8/1999 |
| JP | 2001135496 A | 5/2001 |
| JP | 2003314582 | 11/2003 |
| JP | 2004006348 | 1/2004 |
| JP | 2004507042 A | 3/2004 |
| JP | 2004508725 A | 3/2004 |
| JP | 2005166370 A | 6/2005 |
| JP | 2005291275 A | 10/2005 |
| JP | 2008084605 A | 4/2008 |
| JP | 2009545840 A | 12/2009 |
| JP | 2011233364 A | 11/2011 |
| JP | 2012033499 A | 2/2012 |
| JP | 2012142199 | 7/2012 |
| JP | 2013002590 A | 1/2013 |
| JP | 2013004246 A | 1/2013 |
| WO | 0209481 A1 | 1/2002 |
| WO | 0221541 A2 | 3/2002 |
| WO | 2005055676 | 6/2005 |

OTHER PUBLICATIONS

Fitting H-J et al.,"Electron penetration and energy transfer in sold targets", Physica Status Solidi (A), Applied Research, Berlin, DE, vol. 43, No. 1, Sep. 16, 1977, pp. 185-190, XP009192350.

Anonymous, "CockCroft-Walton Generator", Wikipedia, retrieved Jun. 13, 2014, 3 pages.

Verlag, "Lexikon Der Radiologischen Technik in Der Medizin", 1979, Georg Thieme Verlag, Stuttgart, ISBN: 3-13-484603-09, section on "Wehenltzylinder".

Anonymous, "Oldiffusionspumpe", Wikipedia, Jan. 16, 2013.

International Search Report and Written Opinion for Application No. PCT/EP2014/054837 dated Sep. 8, 2014, 32 pages.

Japanese Office Action for the related JP Application No. 2015-562124 dated Aug. 28, 2017, 16 pages.

Office Action dated Nov. 14, 2017 in related U.S. Appl. No. 15/717,364, 15 pages.

Notice of Allowance dated Jan. 11, 2018 in related U.S. Appl. No. 15/717,388, 9 pages.

Office Action dated Nov. 14, 2017 in related U.S. Appl. No. 15/717,393, 14 pages.

Notice of Allowance dated Feb. 5, 2018 in related U.S. Appl. No. 15/717,372, 10 pages.

Final Office Action dated Feb. 12, 2018 in related U.S. Appl. No. 14/774,424, 17 pages.

\* cited by examiner

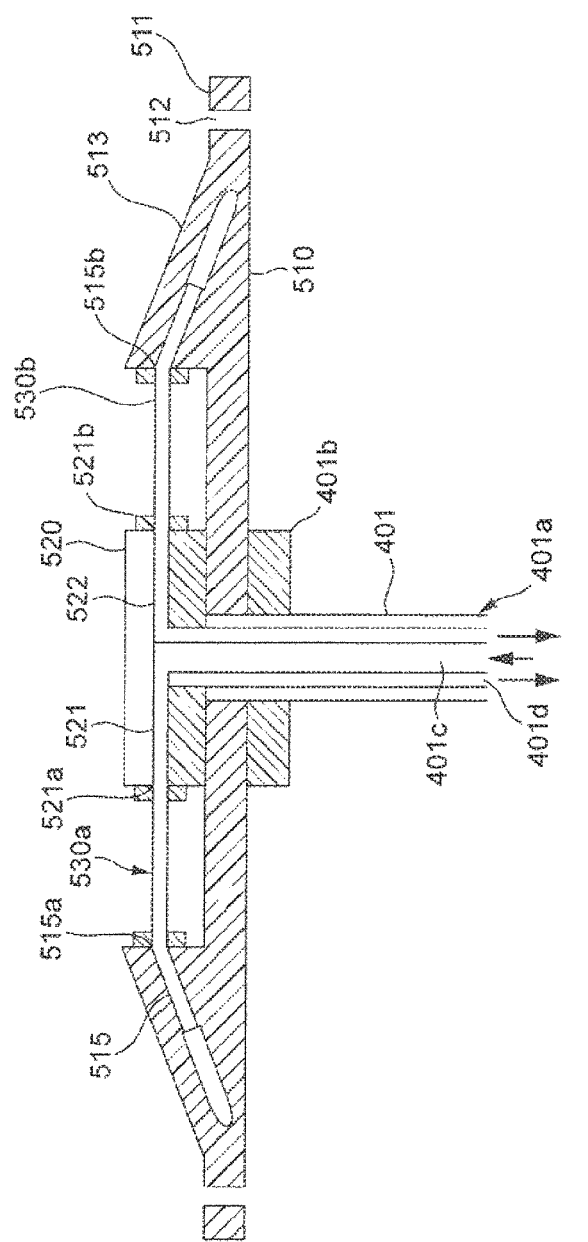

X-RAY SOURCE, HIGH-VOLTAGE GENERATOR, ELECTRON BEAM GUN, ROTARY TARGET ASSEMBLY, AND ROTARY VACUUM SEAL

TECHNICAL FIELD

The present invention relates to an x-ray source, and more particularly to a high-voltage generator, an electron beam gun, a rotary target assembly, a rotary target, and a rotary vacuum seal for the same.

BACKGROUND

X-ray imaging is a valuable tool for research, industrial applications, and medical applications. By irradiating a target object with x-ray radiation, and by detecting the x-rays transmitted through the object, an image of the internal structure of the object can be obtained.

Such an image allows the identification of those portions of the object which relatively more attenuate the passage of x-rays, and those which relatively less attenuate the passage the x-rays. In general, denser materials, and those comprising a high proportion of high-atomic-number atoms or ions, will tend to impede the passage of x-rays to a relatively greater degree. Furthermore, the longer the total path length travelled by the x-rays in the target object, the greater the degree of attenuation. Therefore, in addition to providing structural information, x-ray imaging can provide information about the composition of the object.

Additionally, by rotating the target object relative to the source-detector system, or vice-versa, acquiring a sequence of x-ray images at different angles about the object, and applying computer reconstruction techniques, a 3D volume map of the object can be determined. Such a map allows reconstruction of those volumetric portions of the object which attenuate x-rays to a greater or lesser extent, and thus allows information about the internal structure and composition of an object to be determined in 3D. Such 3D reconstruction is termed computerised tomography, or CT imaging.

Such x-ray imaging techniques are of particular importance in non-destructive testing of industrial products and research specimens. For example, the imaging of turbine blades allows casting defects to be determined, while the imaging of archaeological artefacts allows the structure and composition of an artefact to be determined, even when the object is corroded or encased in sedimentary deposits. For example, such techniques have been invaluable in the determination of the internal structure of the ancient Corinthian analogue computer known as the Antikythera mechanism, even through extensive mineral deposits.

However, the property that enables x-rays to be of advantage in analysing the internal structure of an object, namely their partial attenuation by dense matter, also presents a technical limitation as to their utility. More particularly, if the object is dimensionally large or contains a large amount of radiodense or radiopaque material, being material which presents a relatively high attenuation per unit path length of x-ray radiation, the x-ray beams having passed through the object may be attenuated to such a degree that the contrast or signal-to-noise in the recorded image is poor, and consequently the internal structure or composition cannot be reliably determined.

Where attenuation is only moderate, increasing the total x-ray flux through the object can yield improvements in signal-to-noise and contrast at the detector. However, where the object is so large or so radiodense that a high proportion of the x-rays incident on the object are unable to fully transit the object, but are rather absorbed within the object, a different solution is needed.

The distance an x-ray photon will characteristically penetrate before absorption, the "penetration depth" increases with x-ray photon energy. Therefore, the generation of x-ray sources of high x-ray photon energy, especially to 300 keV or greater, enables the useful x-ray imaging of larger and denser objects. However, commercially practical x-ray sources of suitably high energy have not been produced.

Accordingly, there is a need in the art for an x-ray source which can operate at energies of up to 500 keV, and beyond, and which is suitable for use in commercial and research x-ray applications such as computerised tomography (CT).

SUMMARY

According to a first aspect, there is provided a high-voltage generator for an x-ray source, the generator comprising: an output electrode; a first voltage multiplier; a second voltage multiplier; and a shield electrode disposed to at least partially surround the output electrode; wherein: an output of the second voltage multiplier is electrically connected to the output electrode; an output of the first multiplier is electrically connected to an input of the second voltage multiplier; and the shield electrode is electrically connected to the input of the second voltage multiplier.

In one embodiment, the shield electrode substantially encloses the output electrode.

In one embodiment, the shield electrode circumferentially encloses the output electrode.

In one embodiment, the shield electrode has an emission aperture to allow emission of electrons from an electron emission source mounted at the output electrode.

In one embodiment, the generator further comprises an elongate insulating bushing having first and second ends, wherein: the first and second voltage multipliers are disposed within the bushing; the output electrode is provided at the second end of the bushing; and the shield electrode extends from a region of the bushing intermediate between the first and second ends of the bushing.

In one embodiment, the generator further comprises: a third voltage multiplier; and a secondary shield electrode disposed to at least partially surround the shield electrode wherein: an output of the third voltage multiplier is electrically connected to an input of the first voltage multiplier; and the secondary shield electrode is electrically connected to the input of the first voltage multiplier.

In one embodiment, the generator is arranged to generate a DC potential difference of at least 500 kV, preferably at least 750 kV, between a input to the generator and the output electrode.

In one embodiment, each of the first and second, and optionally the third, voltage multipliers are arranged to generate at least 150 kV, preferably 200 kV, most preferably 300 kV between respective inputs and outputs.

In one embodiment, wherein each of the first and second, and optionally the third, voltage multipliers is a Cockroft-Walton voltage multiplier.

In one embodiment, the generator further comprises one or more surge resistors provided between the output of the first voltage multiplier and the input of the second voltage multiplier, and optionally one or more further surge resistors are provided between the output of the third voltage multiplier and the input of the first voltage multiplier.

In one embodiment, the generator further comprises one or more surge resistors provided between the output of the second voltage multiplier and the output electrode.

According to a second aspect, there is provided an electron beam generator comprising: a high-voltage generator being an embodiment of the first aspect; an electron emission source mounted at the output electrode.

In one embodiment, the electron emission source is a heated filament.

In one embodiment, the electron beam generator further comprises a vacuum enclosure disposed to enclose the output electrode, and the shield electrode.

According to a third aspect, there is provided an x-ray gun comprising: an electron beam generator being an embodiment of the second aspect; and an x-ray emission target positioned for irradiation by the electron beam.

According to a fourth aspect, there is provided an electron beam apparatus comprising: a vacuum enclosure; and an electron beam generator, mounted in the vacuum enclosure, the electron beam generator comprising a high-voltage electrode and an electron emission source mounted at the high-voltage electrode to produce an electron beam, wherein: the electron beam generator further comprises a control module mounted within the electron beam generator; the electron beam apparatus further comprises a remote module mounted relative to the wall of the vacuum enclosure; the control module comprises one of a photodetector and a photoemitter; the remote module comprises the other of the photodetector and the photoemitter; the photodetector is positioned to receive light emitted by the photoemitter; the electron beam apparatus further comprises a transparent conductive shield arranged in the optical path between the photodetector and the photoemitter to cover one of the photodetector and the photoemitter.

In one embodiment, the transparent shield is arranged at and electrically connected to the high-voltage electrode, and the control module is mounted within the high-voltage electrode.

In one embodiment, the transparent shield is arranged at and electrically connected to a wall of the vacuum enclosure.

In one embodiment, a conductive mirror is positioned in an optical path between the transparent shield and the other of the photodetector and the photoemitter that is not covered by the transparent conductive shield.

In one embodiment, the conductive mirror is positioned at or within and electrically connected to the high voltage electrode.

In one embodiment, the conductive mirror is positioned at or outside and electrically connected to the wall of the vacuum enclosure.

In one embodiment, the transparent conductive shield forms part of a vacuum barrier at either a wall of the vacuum enclosure or a wall of the high-voltage electrode.

In one embodiment, a flow path is provided from one side of the transparent conductive shield to another side of the transparent conductive shield to equalise pressure between the one side and the other side.

In one embodiment, the transparent conductive shield comprises a transparent substrate having a transparent conductive layer provided on the transparent substrate.

In one embodiment, the transparent conductive layer is a patterned conductive layer.

In one embodiment, the transparent conductive layer is a conductive film.

In one embodiment, the transparent conductive layer consists of indium tin oxide.

In one embodiment, the transparent substrate is a glass.

In one embodiment, the remote module is removably mounted to the wall of the vacuum enclosure.

According to a fifth aspect, there is provided an x-ray gun comprising the electron beam apparatus being an embodiment of the fourth aspect and a target assembly arranged such that the electron beam from the electron beam generator irradiates an x-ray emission target portion of the target assembly.

According to a sixth aspect, there is provided a rotary vacuum seal for a rotating shaft, the seal comprising: a bore for accommodating the shaft and having a terminal aperture at each of high pressure and low pressure ends; a chamber surrounding and circumferentially adjoining the bore at a position intermediate between the high pressure and low pressure ends; and a flow path extending from the chamber to a port suitable for connection to a vacuum pump.

In one embodiment, the bore is substantially cylindrical between each of the high pressure end and the chamber and the low pressure end and the chamber.

In one embodiment, the chamber is substantially cylindrical.

In one embodiment, the chamber has a minimum internal dimension across the longitudinal axis of the bore of at least 120% that of the bore.

In one embodiment, the seal comprises a rotary bearing for rotatably supporting the shaft in the bore, the bearing optionally being provided as a pair of rotary bearings, preferably roller bearings, at each of high and low pressure ends of the bore.

In one embodiment, the seal further comprises the shaft accommodated in the bore.

In one embodiment, the shaft is substantially cylindrical.

In one embodiment, the bore and shaft are dimensioned such that a pressure of 1 bar maintained at the high pressure end and a pressure of 1 mbar maintained in the chamber results in a mass flow rate of nitrogen at standard temperature between the high pressure end and the chamber of less than 1 mbar l/s.

In one embodiment, the bore and shaft are dimensioned such that a pressure of 1 mbar maintained in the chamber and a pressure of 10-5 mbar maintained at the low pressure end results in a mass flow rate of nitrogen between the chamber and the low pressure end of less than 10-3 mbar l/s.

According to a seventh aspect, there is provided a target assembly for an x-ray source, comprising: a vacuum housing; an x-ray emission target; and a rotary vacuum seal being an embodiment of the sixth aspect, provided to a wall of the housing, wherein the x-ray emission target is mounted on the shaft.

According to an eighth aspect, there is provided a rotary target assembly for an x-ray source, the assembly comprising: an x-ray emission target; a vacuum housing; a shaft mounting the target and traversing a wall of the vacuum housing; a bearing rotatably supporting the spindle; and a bearing housing supporting the bearing and mounted on the wall of the vacuum housing, wherein the bearing housing is mounted by a torque-limiter such that when the torque between the bearing housing and the vacuum housing exceeds a predetermined torque, the bearing housing rotates relative to the vacuum housing.

In one embodiment, the torque-limiter comprises a part which is arranged to inhibit rotation between the vacuum housing and the bearing housing and which is arranged to shear under the predetermined torque.

In one embodiment, the torque-limiter comprises a part which applies a frictional force between the vacuum housing and the bearing housing and which is arranged to allow the vacuum housing and the bearing housing to slide relative to one another under the predetermined torque.

In one embodiment, one of the bearing housing and the vacuum housing has a flange and the other of the bearing housing and the vacuum housing has a clamping assembly; and the clamping assembly is arranged to apply the frictional force to the flange.

In one embodiment, the clamping assembly includes an energy-absorbing plate arranged to contact one side of the flange and a clamp arranged to urge the flange against the energy-absorbing plate.

In one embodiment, the energy absorbing plate is annular.

In one embodiment, the clamp comprises rolling or sliding bearings as a clamping portion to permit the flange to freely slide against the clamping portion.

In one embodiment, the clamp is provided with a bias spring to adjust the clamping force with which the clamp means is urged against the energy absorbing plate.

In one embodiment, at least one of the flange and the plate is circumferentially continuous along a path at which the at least one of the flange and the plate contacts the other of the flange and the plate.

In one embodiment, the clamp is mounted to the energy-absorbing plate.

In one embodiment, the flange and energy-absorbing plate are selected to be mutually non-galling at temperature below 100° C.

In one embodiment, the clamping assembly is arranged to provide over 50 kg, optionally over 80 kg, of force between the flange and the energy-absorbing plate.

In one embodiment, the clamping assembly is arranged to limit the torque transferred between the bearing housing and the vacuum housing after the predetermined torque has been exceeded to less than 10 Nm.

In one embodiment, the predetermined torque is less than 10 Nm.

According to a ninth aspect, there is provided x-ray gun comprising: an electron beam generator and a rotary target assembly being an embodiment of the eighth aspect arranged such that the electron beam from the electron beam generator irradiates a target portion of the x-ray emission target.

According to a tenth aspect, there is provided a rotary x-ray emission target for generating x-ray radiation under electron beam irradiation, comprising: a support hub defining a predetermined axis of rotation of the target, and a plurality of target plates, each consisting of, target material, supported on the hub, wherein the plates are arranged on the hub to provide an annular target region about the axis of rotation.

In one embodiment, the target plates are arranged spaced apart from one another in a circumferential direction of the target region such that the target material of the target region is interrupted between the target plates.

In one embodiment, the interruption of the target material in the target material represents no more than 10%, preferably no more than 1%, further preferably no more than 0.1% of a total circumferential path within the target region.

In one embodiment, the target plates abut one another or overlap to provide a substantially continuous target region of target material.

In one embodiment, each of the target plates are anchored to the hub at a relatively radially inward position of the plate and project relatively radially outward of the hub.

In one embodiment, each of the target plates is in the form of annular sectors.

In one embodiment, the target further comprises a plurality of shield elements supported on the hub and arranged to overlie portions of the target region at which target plates abut or overlap, or at which target material is absent.

In one embodiment, the shield elements are arranged to overlie circumferential-direction edge portions of the target plates.

In one embodiment, the shield elements are axially spaced from the target plates at a position within the target region.

In one embodiment, the shield elements are formed from material having atoms or ions of predominantly lower atomic number than the target material.

In one embodiment, the shield elements are formed of beryllium alloy or aluminium alloy.

In one embodiment, the target material is tungsten or tungsten alloy.

In one embodiment, the target plates, in the target region, have a thickness less than 200% of the electron penetration depth in the target material at 750 keV, preferably less than 150%, more preferably less than 125%.

In one embodiment, the hub has mounting means for mounting the hub to a bearing for rotation about the axis of rotation.

In one embodiment, the hub has a first radially inner region of relatively reduced thickness and a second radially outward region of relatively increased thickness.

In one embodiment, the second region is provided with a plurality of radially-extending passages for cooling fluid; the relatively reduced thickness of the first region defines a recess in an axial face of the hub; and the plurality of passages terminate in corresponding ports provided in a circumferential wall of the recess.

In one embodiment, the plurality of passages are so connected as to define at least one continuous flow path extending from and returning to the wall of the recess.

In one embodiment, the hub comprises a coolant distributor located in the recess and providing: a coolant inlet port and a coolant outlet port; a supply path for coolant supplied to the inlet port to the at least one continuous flow path; and a return path for coolant returned from the at least one continuous flow path to the at least one outlet port.

In one embodiment, the coolant distributor comprises a central boss provided in the recess having the at least one inlet port and at least one outlet port and optionally a plurality of pipes extending from the boss to the ports provided in the circumferential wall of the recess, the central boss having internal passages arranged to distribute coolant, optionally via the plurality of pipes, from the inlet port to the at least one continuous flow path and from the at least one continuous flow path to the outlet port.

According to an eleventh aspect, there is provided an x-ray gun comprising: an electron beam generator and an x-ray emission target being an embodiment of the ninth aspect rotatably positioned such that electrons from the electron beam generator irradiate a portion of the annular target region while the target rotates.

According to a twelfth aspect, there is provided an x-ray source comprising: a cathode electrically connected to a high-voltage generator for emitting an electron beam to a target; and a shield electrode arranged to surround the cathode, the shield electrode having an aperture on the direction of a virtual line connecting the cathode to the target, wherein the shield electrode is maintained at a potential difference relative to the target different to the cathode.

In one embodiment, the x-ray source further comprises an enclosure for accommodating the cathode and the shield electrode, wherein the shield electrode is displaced between the cathode and the enclosure.

In one embodiment, the shield electrode has a plurality of electrode elements, electrode element having an aperture and is being disposed to surround the cathode.

In one embodiment, each of the plurality of electrode elements is maintained at a different voltage such that the relative potential between each of the electrode elements and the target becomes lower with proximity of the respective electrode element to the enclosure.

In one embodiment, the x-ray source further comprises a Wehnelt disposed around the cathode, wherein the potential difference between the Wehnelt and the target is greater than the potential difference potential between the cathode and the target.

In one embodiment, the x-ray source further comprises a high voltage generator according to any one of claims 1 to 14 arranged to provide the potential difference between the cathode and the target.

In one embodiment, the shield electrode has a second aperture at a different position to the aperture.

BRIEF DESCRIPTION OF THE DRAWINGS

To better understand the present invention, and to show how the same may be carried into effect, reference will be made, by way of example only, to the accompanying Figures, in which:

FIG. 11B shows a transverse section along the line I-II shown in FIG. 11A;

DETAILED DESCRIPTION

Basic Construction and General Principles

X-rays may be produced by irradiating a target made of a material containing a large proportion of high atomic number atoms or ions with a suitably high-energy electron beam. The electron beam is produced by accelerating electrons across a large potential difference and then guiding the beam to the target. The electrons in the electron beam interact with the electric field of the high atomic number nuclei and emit x-ray photons through the Bremsstrahlung process. The x-rays thus generated have a continuous spectrum, having an upper energy limit determined by the energy of the incident electrons.

However, with an exemplary electron beam of 100 keV, only 1% of incident electron beam energy is typically converted into x-ray radiation; the remainder is deposited in the target as heat. While the proportion of beam energy which is converted into x-ray radiation increases with increasing electron beam energy, for most commercial and research applications, the majority of the beam energy is deposited in the target as heat.

Since x-rays produced through the Bremsstrahlung process are emitted with an angular distribution, a beam of x-rays may be derived from the same side of the target as the incident beam, in reflection mode, or from the opposite side of the target to the incident beam, in transmission mode. For high-resolution imaging, transmission mode is preferred, since the electron beam can be focussed to a small spot, leading to the creation of a small-dimension x-ray source. However, since the target must be thin enough not to absorb the emitted x-rays, targets used in transmission mode cannot easily dissipate the thermal energy generated by a high flux of electrons.

Figure 1:
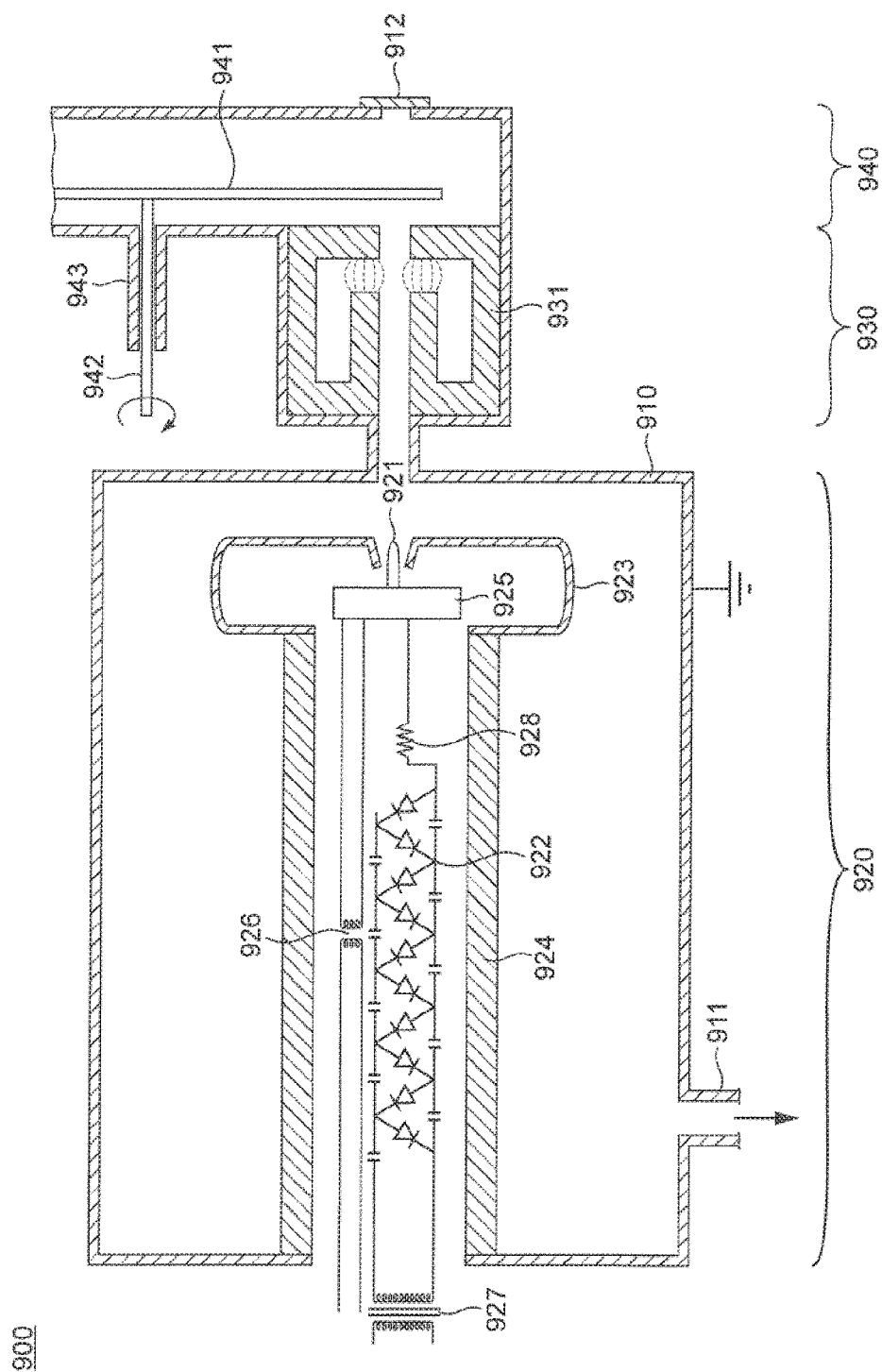
FIG. 1 shows an example of a known x-ray source.

A known x-ray source that is suitable for CT imaging is shown in FIG. 1. The x-ray source of FIG. 1 is encased in a vacuum enclosure 910, which is pumped to a high vacuum, typically $10^{-5}$ mbar or better. Such vacuums are achieved by ensuring that the enclosure is suitably vacuum-sealed and then by applying a suitable vacuum pump, such as a turbo pump, to pump port 911. High vacuum is necessary to support the electron beam.

The vacuum enclosure is held at ground potential, and a high-voltage is generated at a high-voltage electrode 923 by high-voltage generator 920. In high-voltage generator 920, high-voltage electrode 923 is provided within the enclosure 910 and is raised to a suitably high (negative) potential difference relative to the grounded enclosure 910 by voltage multiplier 922.

In the example of FIG. 1, voltage multiplier 922 is a Cockroft-Walton voltage multiplier, consisting of a network of appropriately arranged capacitors and resistors, which accepts an alternating input voltage through input isolation transformer 927 and outputs a high-voltage negative DC potential to electrode 923. Such high-voltage generators are well known in the art, and the voltage multiplication factor is determined by the number of series capacitors on each leg of the multiplier and the value of those capacitors.

However, the voltage attainable at the high-voltage electrode, in practice, is limited by the voltage at which the high potential difference which exists between high-voltage electrode 923 and the grounded vacuum enclosure 910 will cause residual gas in the vacuum enclosure 910 to ionise. Such ionisation causes the high voltage achieved to dissipate through arc discharge to the wall of the enclosure 910. The voltage achievable in practice is thus limited by a number of factors.

A first factor is the degree of vacuum achievable within the chamber, since softer, i.e., higher-pressure vacuums will undergo electrical breakdown at lower voltages. At vacuums of $10^{-4}$ mbar or better, the vacuum dielectric strength is near maximum.

A second factor is the distance of the surface of the high-voltage electrode 923 from the wall of the chamber, closer distances of approach being associated with a lower voltage at which electrical breakdown will occur. Such distances do not, in practice, scale linearly with voltage; at high voltages, ions which might be generated at sub-breakdown densities can be accelerated and can themselves generate secondary ions. The density of secondary ions along the path of an accelerated ion can be sufficiently high to trigger a discharge event, even over long distances.

A third factor is the shape of the high-voltage electrode 923, as sharply-curved surfaces concentrate potential gradients and encourage ionisation. Therefore the shape of the high-voltage electrode 923 is usually provided in a cylindrical shape, bell-shape or a toroidal-shape to ensure that those portions of the high-voltage electrode 923 which are nearest to the walls 910 do not exhibit a high radius of curvature.

Another route by which the high-voltage electrode 923 could discharge is through the components which accumulate various potentials within the voltage multiplier 922. Therefore, the voltage multiplier itself is enclosed within an elongate insulating bushing 924, which extends from a rear wall of the enclosure 910 and which supports the high-voltage electrode 923 at its other end. The interior of bushing 924 may be filled with an insulating substance, such as dielectric oil, to further inhibit discharge within the bushing. Bushing 924 is here cylindrical.

A final discharge route is possible along outer surface of bushing 924. Bushing 924 must be made sufficiently long to reduce the potential gradient along the bushing and to inhibit such discharges. Again, the maximum safe length of bushing 924 does not scale linearly with voltage.

However, in the design of x-ray sources, and high-voltage systems in general, it is recognised that under certain conditions even a well-designed system will undergo unintended arc discharge between the high-voltage electrode and a nearby surface at ground potential. However, in vacuum systems which need to be opened for maintenance, microcavities within parts of the vacuum system can momentarily release enough gas to drop the vacuum dielectric strength and permit discharge. In such events, a very large current will flow from the voltage multiplier to the ground through the arc which, if unimpeded, will tend to damage the components of the voltage multiplier. Therefore, a surge resistor 928 is installed between the output of the voltage multiplier 922 and the high-voltage electrode 923 to limit the maximum current which will flow in the event of discharge of the total stored potential in the high-voltage multiplier along an unintended path.

The function of the high-voltage generator is to provide a suitably large (negative) voltage to accelerate electrons from an electron source maintained at the high voltage to form the electron beam. The electron source 920 in the known example of FIG. 1 is a heated filament 921 provided at the high-voltage electrode 923. The high-voltage electrode 923 has a small aperture at a forward surface of the electrode through which the filament 921 protrudes. The filament is also connected to the voltage multiplier 922 and is thus maintained at substantially the same voltage as the high-voltage electrode 923.

The heated filament is heated to a temperature at which the electrons in the filament are liberated by thermionic emission and can travel away from the filament in free space under influence of the high potential difference between the high-voltage electrode 923 and the grounded vacuum enclosure 910. To achieve this high temperature, an oscillating potential is applied to the filament on top of the high voltage already achieved with the voltage multiplier 922, by means of isolating transformer 926, which also inhibits discharge of the high voltage to ground through the heating current supply. The isolating transformer for the heating current supply is also contained within insulating bushing 924.

The high-voltage electrode 923, in addition to providing the accelerating potential relative to ground also acts as a Faraday shield to screen the interior of the electrode from the potential difference between the electrode 923 and the wall of the vacuum enclosure 910. Therefore, in the arrangement of FIG. 1, the high-voltage electrode 923 is also termed in the art a "Faraday housing". The Faraday housing thus can also screen any control electronics, conceptually represented as control module 925, at the high voltage side of the voltage multiplier 922, from the potential gradients within vacuum enclosure 910. The interior of the high-voltage electrode 923, as with bushing 924, may be filled with an insulating material, such as a dielectric oil, an insulating gas or a potting resin, to further reduce the possibility of discharge within the bushing.

Therefore, in FIG. 1, when the high-voltage electrode 923 is raised to a suitably high potential, and when filament 921 is raised to a suitably high temperature, a beam of electrons will be accelerated from the filament, which is maintained at a voltage close to the high voltage, for example at a voltage within 0.1% to 1% difference from the high voltage, and is directed by the high-voltage electrode 923 toward the housing of the enclosure 910 in a forward direction. The bell shape or toroidal shape of high-voltage electrode 923 creates an appropriately-shaped isopotential which encourages the electrons to be accelerated in a forward beam, rather than with a broad angular distribution. Alternatively, a cylindrical electrode with radiused edges can be used together with a planar or slightly depressed focus cup maintained at the same potential as the high-voltage electrode and arranged to surround the filament and having a geometry to direct the electrons as a forward beam. The combination of electron source and high-voltage generator shown in FIG. 1 thus acts as an electron beam generator.

In such a configuration, the forward face of the high-voltage electrode 923 closest to the filament 921 acts as a so-called "Wehnelt", which acts as a control grid and convergent electrostatic lens, such that by control of the voltage of the high-voltage electrode 923 relative to the filament 921, the electron beam can be progressively restricted to a forward pencil beam and eventually cut off due to the repulsive field of the Wehnelt. As mentioned above, the negative grid voltage of the electrode relative to the accelerating voltage between the filament 921 and the grounded enclosure can be set as 0.1% to 1% of the accelerating voltage, with 0.1% providing a small amount of beam shaping to encourage forward emission, and 1% cutting off the beam entirely. However, with different geometries, the ratio of grid voltage to accelerating voltage may be chosen to suit the application requirements. The Faraday housing and Wehnelt can be integral, or can be discrete. In some applications, the Faraday housing and the Wehnelt can be set to have the same potential as the filament, or the Faraday shield could be set to have the same potential as the filament while the Wehnelt has a small negative potential relative to the filament.

The electron beam produced from the filament passes into a magnetic lens 930, having focussing coils 931, which functions to focus the electron beam to a spot on a target 941. Target 941, in the region at which the spot is produced, includes a material which emits x-rays under electron beam irradiation. For example, tungsten or a similar material having a high atomic number and a high thermal conductivity may be used. Target 941 is maintained at the same or a similar potential, such as ground potential, as the enclosure.

The focussing of the electron beam before application to target 941 is advantageous, since it is the size of the interaction volume of the beam with target 941 that determines the size of the x-ray source used to image a target. As may be understood from straightforward ray optics, when the size of the illumination source is large, the shadows cast by an opaque object placed between the source and the projection plane will have soft edges and will therefore provide a lower-resolution image of the object; conversely, when the source is small, the shadows cast will be sharp and the projected image will have a relatively higher resolution. So too with x-ray imaging; when the source is small, the images produced will be sharper, have higher magnification and will thus provide higher resolution and more information. Focussing of the beam to a small spot is therefore advantageous for 3D reconstruction in a CT process.

However, when the electron beam is focussed to a small spot size, which can include spots having dimensions on the order of microns in so-called microfocus x-ray systems, the energy deposited per unit area at the location of the spot in the target is high, especially in the case of high electron energies, leading to high x-ray photon energies, and for high electron fluxes, leading to high x-ray fluxes. The deposited energy not converted to emitted x-rays, being the majority of the incident beam energy, is dissipated as heat in the target.

There is therefore a problem that the target may begin to melt or deform under the intense local heating. Therefore, to avoid thermally stressing the target, the target is conventionally formed as an extended piece of target material which is continually moved through the focus spot sufficiently quickly to continually present a new, cold target surface to the incident beam and thus to ensure that even if the instantaneous incident energy density is large, the average energy deposited per second per unit area in the target material does not become excessive. In the arrangement of FIG. 1, this is achieved by forming the target as a plate 941, and then by rotating the plate 941 about an axis by means of shaft 942. Since the target 941 is also within the vacuum enclosure 910, the shaft passes to the outside of the vacuum enclosure through a vacuum seal 943.

The x-ray beam emitted from the target as a consequence of the irradiation of the target by the electron beam originating from filament 921 leaves the vacuum enclosure through x-ray window 912. A target object may thus be interposed between x-ray window 912 and a suitable detector such as a sheet of x-ray sensitive film, and x-ray images may be acquired.

In the apparatus of FIG. 1, it is difficult to achieve a sufficiently high voltage at the high-voltage electrode 923 for dense or extended target objects without making the vacuum enclosure 910 extremely large. Further, it is difficult to make the bushing 924 sufficiently resistant to such a sufficiently high voltage. Particularly, it is difficult to achieve electron beams approaching or in excess of 500 keV, preferably 750 keV. Therefore, the present inventor devised the modified arrangement shown in FIG. 2.

Figure 2:
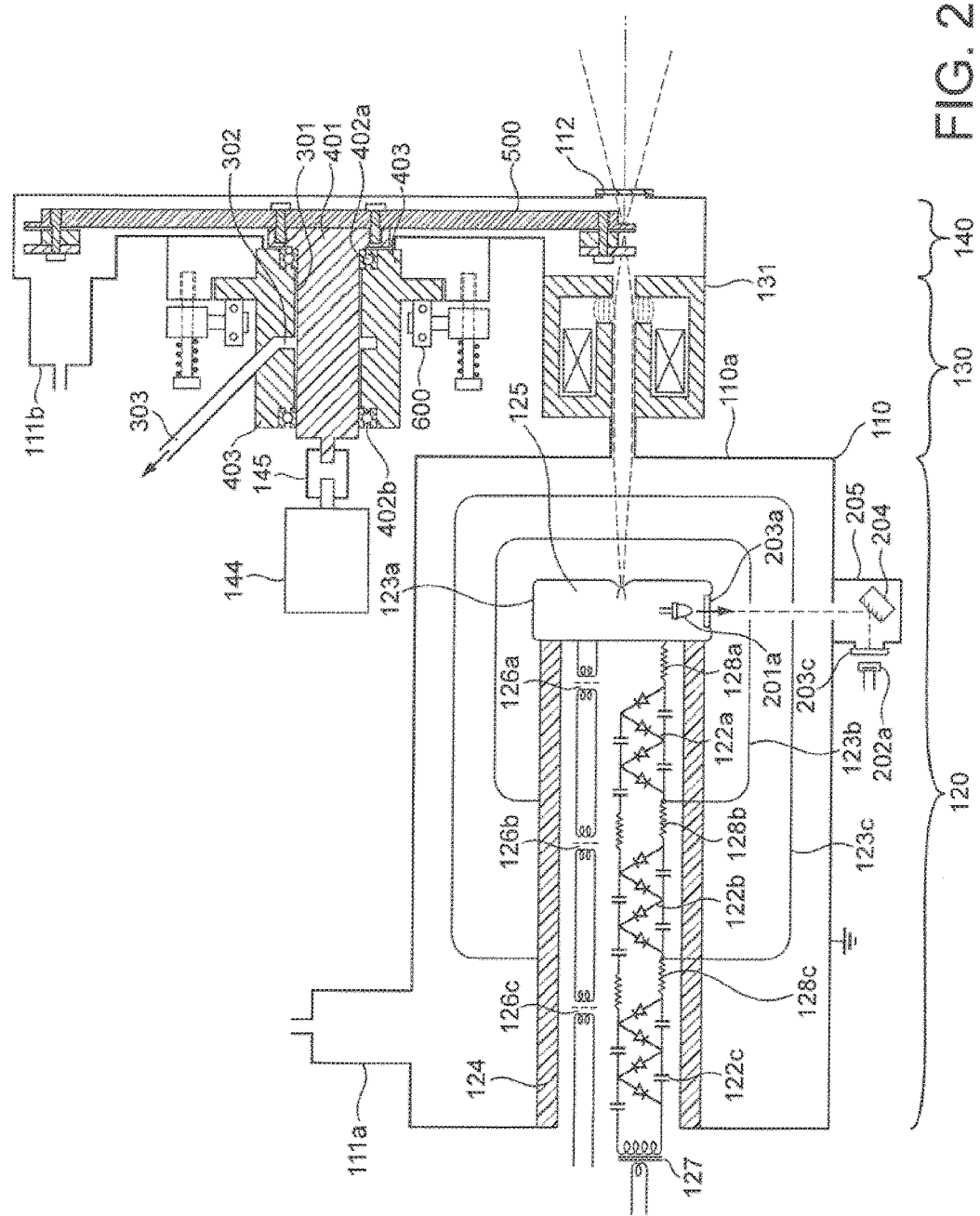
FIG. 2 shows a schematic overview of an x-ray source being an embodiment of the present invention.

The x-ray source in FIG. 2, while retaining many structural and functional similarities, as will be evident to one skilled in the art, differs from that shown in FIG. 1 in several important aspects. Components having reference numbers 1xx in FIG. 2 should be taken to have essentially similar construction and function to the components shown with corresponding reference numbers of the form 9xx in FIG. 1, except where otherwise described.

The High Voltage Generator

Firstly, the construction of the high-voltage generator 120 of the embodiment of FIG. 2 differs from that disclosed in FIG. 1. Specifically, the high-voltage generator 120 of FIG. 2 has a multi-stage voltage multiplier 122, consisting of three individual Cockroft-Walton voltage multipliers 122*a*, 122*b*, 122*c* arranged serially. The output of each individual voltage multiplier is connected to the input to the next voltage multiplier, except for the final voltage multiplier which has an output connected to the high-voltage electrode, such that the high-voltage electrode 123*a* is an output electrode of the high-voltage generator taken as a whole. Further, the output of each voltage multiplier except for the terminal voltage multiplier 122*a* is connected to a shield electrode 123*b*, 123*c*.

Each shield electrode 123*b*, 123*c* is disposed to surround, preferably to coaxially surround, the high-voltage electrode 123*a*, and also to surround any shield electrodes which, in operation, achieve a higher potential relative to it. Thus, shield electrode 123*c*, surrounds shield electrode 123*b* and high-voltage electrode 123*a*. Although there are three stages to the multi-stage voltage multiplier shown in FIG. 2, the number of stages can be varied and may, for example, omit the first stage 122*c* and the first shield electrode 123*c*. Alternatively, four or more stages could be provided, each associated with its own shield electrode. It is advantageous that each shield electrode also has an emission aperture at a forward surface to permit free passage of the electron beam generated from filament 121, and further advantageous that each field electrode 123*b*, 123*c* and the high-voltage electrode 123*a* at the exit point of the electron beam, follows an isopotential line, to avoid disturbing the beam trajectory. However, in most circumstances, cylindrical shield electrodes, optionally having radiused edges, are sufficient to avoid breakdown, and other geometries may be adopted without limitation beyond practical constraints. The shield electrodes can be continuous, or can be formed of mesh. If formed of mesh, the apertures of the mesh can obviate the requirement for a defined emission aperture.

The advantage of providing nested electrodes in the manner shown in FIG. 2 is that a smaller potential difference exists between each shield electrode and the electrode which it immediately encloses than exists between the enclosed electrode and the wall of enclosure 110. As a result of this arrangement, a potential difference, which would cause an arc in vacuum or a discharge along the bushing between two electrodes separated by a given distance, will not cause an arc or discharge when an electrode operating at an intermediate voltage is placed at an intermediate distance between those electrodes, due to the nonlinear behaviour of the breakdown process with potential difference.

Advantageously, the intermediate or shield electrode is positioned approximately equidistant between the high- and low-voltage surfaces, and is maintained at a potential intermediate between those surfaces. Therefore, in a generator such as that shown in FIG. 2, the high-voltage electrode 123*a* may be maintained at 750 kV, the first shield electrode 123*b* may be maintained at 500 kV and the second shield electrode 123*c* may be maintained at 250 kV each relative to grounded enclosure 110. However, in other embodiments, potentials between the shield electrodes may alternatively be at least 150 kV, at least 200 kV, or at least 300 kV.

For example, in some configurations, with 500 kV of potential between two cylindrical electrodes, a pressure of $1 \times 10^{-4}$ mbar and a spacing between the two electrodes of 150 mm, breakdowns can occur with a frequency more than hourly, but the same configuration having an additional intermediate equidistant shield electrode maintained at 250 kV will exhibit breakdown rarely.

Therefore, an improved (higher) degree of potential difference can be maintained between high-voltage electrode 123a and the grounded vacuum enclosure 110 whilst keeping the overall size of the apparatus relatively small. The provision of such a high voltage at the high-voltage electrode 123a allows electron energies of 750 keV to be achieved in the electron beam exiting through the aperture in the output, first and second shield electrodes, entering magnetic lens 130 and being brought to a focus on target 500. Therefore, very high x-ray photon energies, namely an electron beam spectrum with a peak yield at 500 keV and extending up to 750 keV, may be achieved in the x-ray beam produced from target 500.

In the multi-stage voltage multiplier shown in FIG. 2, it is also advantageous that the isolating transformer providing the alternating heater current to filament 121 be divided into three isolating transformers 126c, 126b and 126a, in sequence, to avoid the need for isolating transformers that are rated higher than the potential difference between each stage of the multiplier, and to maintain all components at a given position along a length of the bushing 124 at a similar potential and thus to avoid the need for enhanced insulation within the bushing 124.

Figure 3:
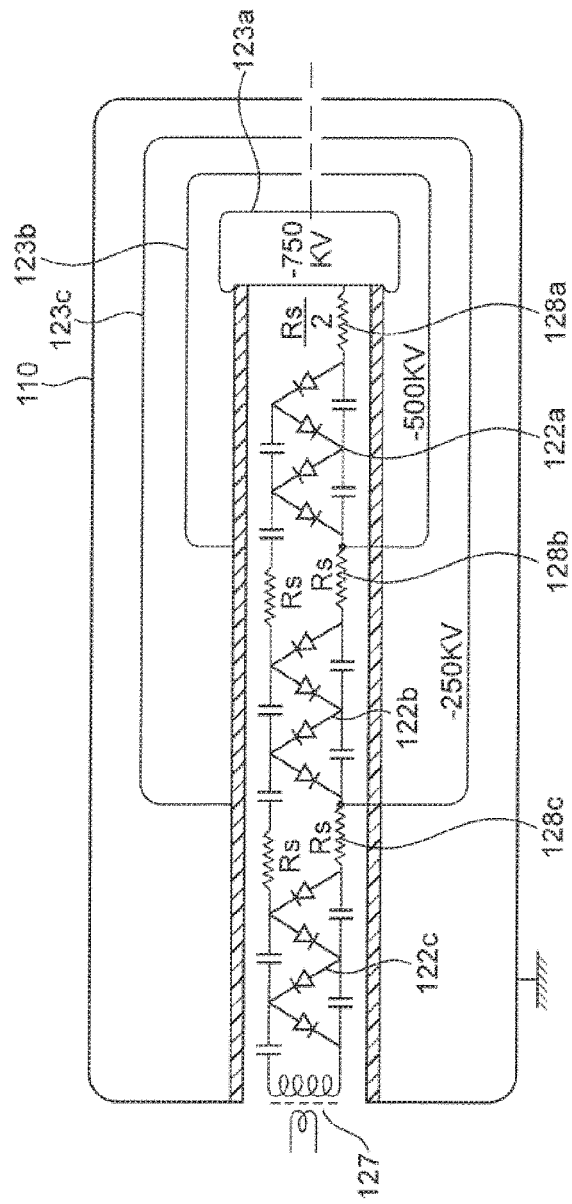
FIG. 3 shows a schematic view of an electron beam gun in the embodiment of FIG. 2.

Also advantageously, surge resistors 128a, 128b and 128c are provided at the output of each stage of the multi-stage voltage multiplier. Doing so allows each surge resistor to experience only a proportion of the total voltage, allowing lower-resistance resistors to be used for a given voltage and maximum allowable surge current. For example, as shown in FIG. 3 omitting the drive transformers for the filament for clarity and using a notional value for each resistor $R_S$ between the output of one voltage multiplier and the input to the next, and providing a terminal surge resistor 128a having a value $R_S/2$ allows each intermediate resistor to experience only one-third of the total voltage. Further, having the terminal resistor 128a being selected to have the value $R_S/2$ additionally allows the voltage across each stage of the voltage multiplier to collapse at the same rate (assuming all capacitors are of equal value). Therefore, even if undesired breakdown should occur, the energy can be safely dissipated. As a consequence, the bushing 124 need only be rated for 250 kV, since this is the maximum potential difference that it will need to sustain during a breakdown event. Finally, the intermediate resistors protect the voltage multiplier from high currents associated with self capacitances of the electrodes to each other, and protect all possible discharge paths.

In practice, the value of the surge resistors 128a, 128b and 128c can be selected according to the requirements in place; lowering the value of the surge resistors will increase the efficiency of the transfer of the drive voltage to the upper stages, while raising the value of the surge resistors will tend to improve the protection of the multiplier components against discharge events.

A further advantage of the configuration of the high-voltage generator shown in FIG. 3 is that a diminished potential difference exists between the elements of the high-voltage generator within bushing 124 and the shield electrode surrounding any section of bushing. Therefore, the thickness of the bushing can be reduced, and need not be rated for the full potential difference between high-voltage electrode 123a and earth. Rather, it need only be rated for the maximum potential difference between nested electrodes, for example for 250 kV.

Of course, the arrangement shown in FIG. 2 is purely exemplary, and a number of modifications may be made, depending on the engineering requirements for the x-ray source.

For example, in FIG. 2, the shield electrodes 123b and 123c substantially enclose the high-voltage electrode 123a, but in arrangements wherein the important dimension is the radius of the vacuum enclosure 110 with respect to the beam path, and wherein additional clearance may be provided between the high-voltage electrode 123a and the front wall 110a of the enclosure along the beam emission direction, each of the two shield electrodes need only circumferentially enclose the high-voltage electrode. Such a design would, however, require the bushing 124 to be rated to sustain the full potential difference between the high-voltage electrode and the grounded vacuum enclosure 110 across its thickness.

Using the arrangement shown in FIG. 2, even if a very high electron beam energy is not required, the apparatus can be made more dimensionally compact for a given beam energy. However, in embodiments of the present invention, it is presently preferred that at least 150 kV, preferably 250 kV, and most preferably 300 kV is provided by each stage 128a, 128b and 128c of the voltage generator. Such an arrangement allows the beam energies of 750 keV to be provided from a compact enclosure.

Also, in some embodiments, the shield electrodes can each be driven by different high-voltage generators to the generator driving the high-voltage electrode 123a, for example if there is not considered to be significant likelihood of discharge along the length of the bushing, rather than the series arrangement of generators described above.

The High-Voltage Electrode Control System

In the arrangement of FIG. 2, it is sometimes necessary to provide control signals to and from a control module located within high-voltage electrode 123a, in order to monitor the state of the filament 921 and to control the temperature and relative potential of the filament 921, for example. However, it is not preferred to simply run control lines along the bushing, as these would need to be isolated at each stage of the high-voltage generator to prevent discharge of the high voltage along the control lines.

To solve this problem, the arrangement of FIG. 2 adopts an opto-coupled control mechanism, involving photoemitters 201a and photodetectors 201b (not shown) functioning as a control module mounted at and enclosed within high-voltage electrode 123a and communicating optically with corresponding photoemitters 202a and photodetectors 202b (not shown) functioning as a remote module mounted at the wall of the vacuum enclosure 110. The photoemitters and photodetectors mutually relay signals, analogue and digital, through the vacuum from the wall of the vacuum enclosure 110 to the interior of the high-voltage electrode 123a, and vice versa, without providing any conductive path, advantageously enabled by apertures in each electrode 123a, 123b and 123c which permit the light of the wavelength used in the communication to pass.

In the embodiment of FIG. 2, the photoemitters 201a, 202a are pre-focused near infrared LEDs, while the photodetectors 201b, 202b are photodiodes operating in the near infrared.

Owing to the electron beam emitted from the electron beam gun 120, residual gas remaining within the vacuum enclosure 110 can, however, become ionised and tend to drift to regions of high or low potential, depending on the charge on the relevant ion. Such ions can deposit on the optical surfaces of the photoemitters and photodetectors, which are normally insulating plastic.

Therefore, over extended operation and periods without maintenance or cleaning of these optical surfaces, there may be a tendency for the communications to fail over time due to the contamination of the optical surfaces.

One solution to this problem is to provide transparent shields in front of each respective photoemitter and photodetector to enable easier cleaning and to permit replacement of the shields when they become contaminated. However, when conventional transparent plastics or glasses are used for such shields, the present inventor has discovered that there still remains the likelihood that the efficiency of the optical communications will degrade over time, possibly causing unpredictable apparatus malfunctions.

The present inventor has realised that the tendency of plastic surfaces to easily acquire and maintain a static electric charge from the incident ions could be an important contributing factor in this phenomenon. Therefore, in the arrangement of FIG. 2, transparent shields 203a, 203b (not shown), 203c and 203d (not shown), each having a transparent conductive coating, are provided to cover each of the respective relay photoemitters and photodetectors 201a, 201b, 202a and 202b, such that the conductive coating is coupled either to the high-voltage electrode or the earthed walled vacuum enclosure 110, depending on the location of the shield.

In the embodiment of FIG. 2, the transparent shields are provided as windows which form part of the vacuum seal of the high-voltage electrode 123a and the vacuum enclosure 110, respectively, and are arranged to have their conductive coating on the side of the shield opposite to the side at which the photoemitter or photodetector is arranged, being the side exposed to the vacuum. Therefore, not only do the transparent shields collect any deposits which might otherwise have deposited directly on the photoemitter or the photodetector, they are also able, by virtue of the conductive coating, to dissipate local static charge and are thus less likely to attract and retain such coating.

The conductive transparent shield can be provided by any means conventionally known in the art. The arrangement of FIG. 2 employs a transparent glass substrate, such as borosilicate, coated with a transparent conductive coating of indium tin oxide (ITO), although other transparent substrates and other transparent conductive coatings, for example a conductive metal pattern deposited on a transparent plastic substrate, are also usable.

The arrangement of FIG. 2 also employs an additional countermeasure against unwanted deposits, shown in conjunction with photodetector 202a provided in the wall of the vacuum enclosure 110, although equally applicable to a photoemitter in the wall of the vacuum enclosure or a photodetector or photoemitter within high-voltage electrode 123a. The detail of this countermeasure is shown most clearly in FIG. 6, which is an enlargement of the remote module including photodetector 202a forming part of the wall of vacuum enclosure 110.

Figure 6:
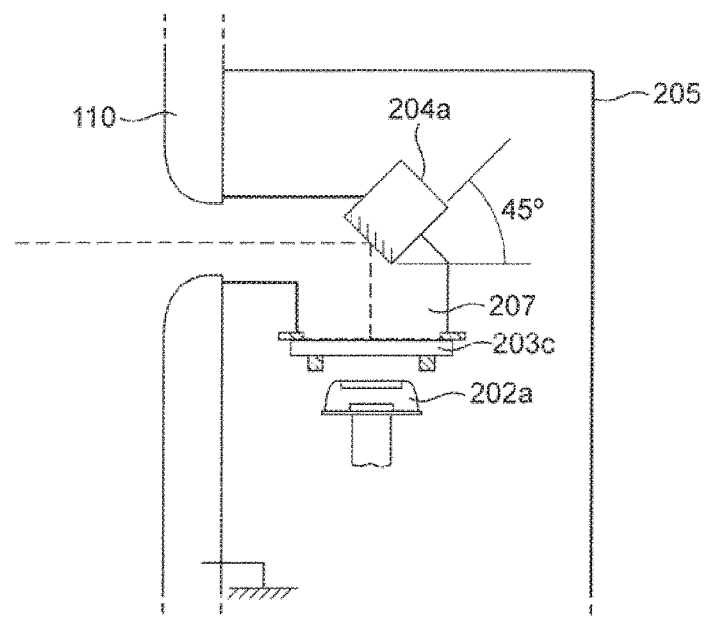
FIG. 6 shows a detail of a remote module for use with the electron beam gun shown in the embodiment of FIG. 2.

In the arrangement of FIG. 6, the transparent conductive shield 203c covering photodetector 202a and forming part of the vacuum seal of vacuum chamber 110 is provided at the end of a channel 207 provided in housing 205, which forms a removable part of the vacuum enclosure 110. Channel 207 has one end opening onto a portion of the vacuum enclosure 110 which encloses high-voltage electrode 123a and another end terminating in shield 203c located in front of photodiode 202a. Channel 207 has a bend, in the embodiment of FIG. 6 being an approximately right-angled bend, and mirror 204a is located in the bend of channel 207 to redirect light arriving from the photoemitter 201a provided in the high-voltage electrode 123a into photodetector 202a.

The provision of channel 207 and mirror 204a is advantageous in that ions which are produced due to the effect of the electron beam will travel ballistically along the channel 207 and tend to deposit on the surface of the mirror 204a, rather than on shield 203c. Mirror 204a may easily be made of a conductive material, such as a metal, and therefore even the tendency of ionised particles to deposit on mirror 204a due to the presence of static charge will be reduced. However, if such deposits do occur, the mirror may easily be removed and replaced by detaching housing 205 from vacuum enclosure 110 and replacing the mirror, without the need to disturb the relatively more delicate conductive transparent shield 203c.

Figure 5:
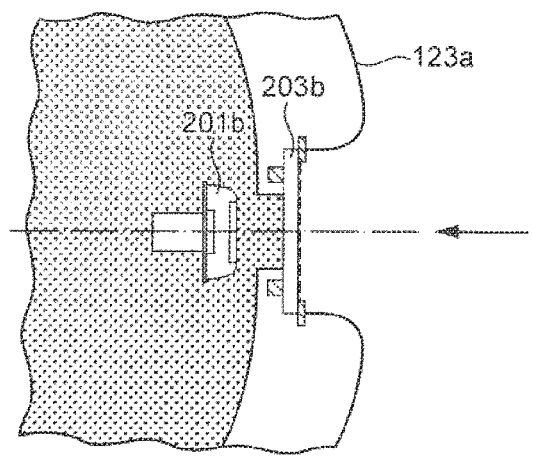
FIG. 5 shows another detail of the high-voltage electrode of the electron beam gun in FIG. 3.

However, if regular maintenance is scheduled for the apparatus, such arrangements may not be necessary, and some or all of these countermeasures may be omitted. For example, FIG. 5 shows transparent conductive shield 203b provided as part of the vacuum seal formed by high voltage electrode 123a and covering photodetector 201b, with photodetector 201b shown surrounded by insulating oil.

Figure 4:
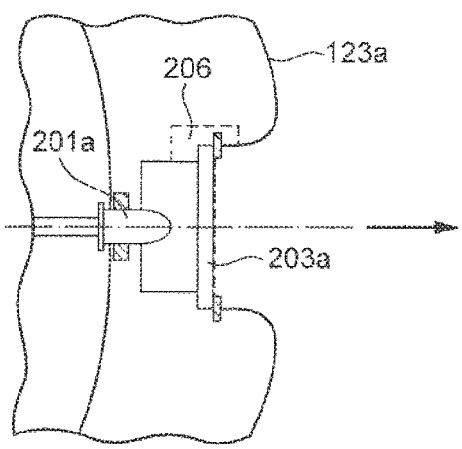
FIG. 4 shows an enlarged view of the high-voltage electrode of the electron beam gun in FIG. 3.

However, as shown in FIG. 4, the transparent shield 203a need not be provided as part of the vacuum seal provided by the vacuum enclosure or the high-voltage electrode as such, but may be positioned at the vacuum enclosure or high-voltage electrode or within the vacuum enclosure or high-voltage electrode. If provided at a wall of the vacuum enclosure or high-voltage electrode, a vacuum relief channel 206 may be provided (shown in the embodiment of FIG. 4 in high-voltage electrode 123a) to permit the space on each side of the transparent shield 203a to achieve equal pressure.

In principle, the transparent shield could be mounted at some distance in front of the photodetector or photoemitter. Such arrangements would, however, need the shield to have a relatively larger area to actively reduce contamination arriving at the photodetector or photoemitter. Therefore, the present arrangement, shown in FIG. 2, wherein the transparent shields 203a, 203c are mounted at the high-voltage electrode and the wall of the vacuum enclosure 110, is preferred.

Furthermore, the conductive shields may be provided only for the photodetectors and photoemitters provided in the high-voltage electrode, only for the photodetectors and photoemitters provided at the wall of the vacuum enclosure 110, only for the photodetectors, or only for the photoemitters, depending on the ease of reaching each of these parts, the ease of cleaning each of these parts, and empirically determined rates of deposition on each.

Preferably, housing 205 shown in FIG. 6 is removably mounted from the remaining wall of vacuum enclosure 110 to enable user replacement of mirror 204a and cleaning of transparent shield 203c, but housing 205 could alternatively be formed integrally with the wall of vacuum enclosure 110, as required.

Low-Friction Rotary Vacuum Seal

Once the electron beam is emitted from the filament 121 located in high-voltage electrode 123a, it is brought to a focus by magnetic lens 131, and interacts with rotating target 500.

Figure 7:
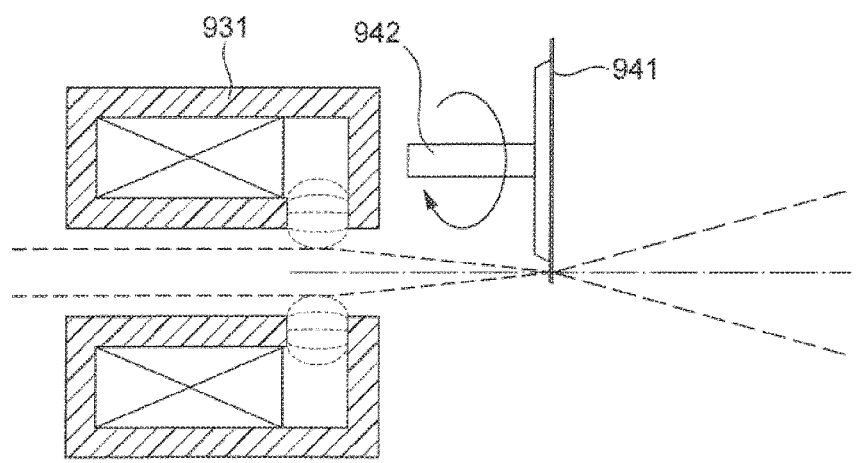
FIG. 7 is a schematic view showing the principles of generation of a high-flux microfocus x-ray beam from a focussed electron beam using a rotating transmission target.

The process of x-ray beam generation from a microfocus electron beam spot on a rotating target is schematically shown in FIG. 7. However, due to the high electron beam energy possible with the arrangement of FIG. 2, as well as the high flux necessary to achieve excellent signal-to-noise, the energy deposited into the microfocus spot on the rotating target 941 can be very high. Therefore, either the cooling provided to target 941 must be very efficient, the target 941 must have very high thermal capacity, or the target material must move sufficiently rapidly past the microfocus position of the electron beam so as not to deform or melt under the thermal load.

Figure 8A:
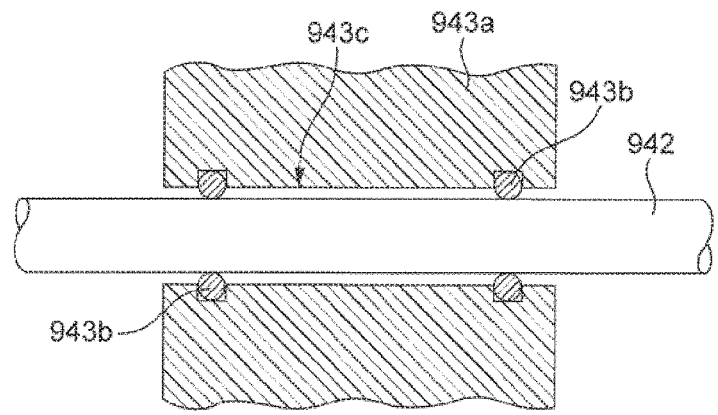
FIG. 8A shows a conventional type of vacuum seal for a rotating shaft.

To achieve a sufficiently fast transit of the target material past the microfocus point using a rotating target disc requires a target disc of large diameter driven at a high angular speed. In a rotating target arrangement such as that shown in FIG. 1, the target disc 941 may be driven by a shaft 942 which passes from inside the vacuum enclosure 910 to the outside of the vacuum enclosure 910 via rotary vacuum seal 943, which permits rotation of the shaft while inhibiting a flow of gas from outside the vacuum enclosure 910 to the interior. A conventional vacuum seal arrangement is shown in FIG. 8a, wherein housing 943a defines a bore 943c through which shaft 942 passes, and supports seal elements 943b which inhibit the flow of gas from one end of the bore 943c to the other. Seal elements 943b can be provided as O-ring seals, lip seals, or even ferrofluid seals. However, all of these arrangements have the disadvantage that the contact between shaft 942 and seals 943b generates friction in the system, and limits practical speeds to around 6000 revolutions per minute (rpm). Alternative arrangements, such as driving the target using a rotating magnetic field and a follower magnet on the target, have difficulty transmitting enough torque for fast yet controlled rotation of large targets.

Figure 8B:
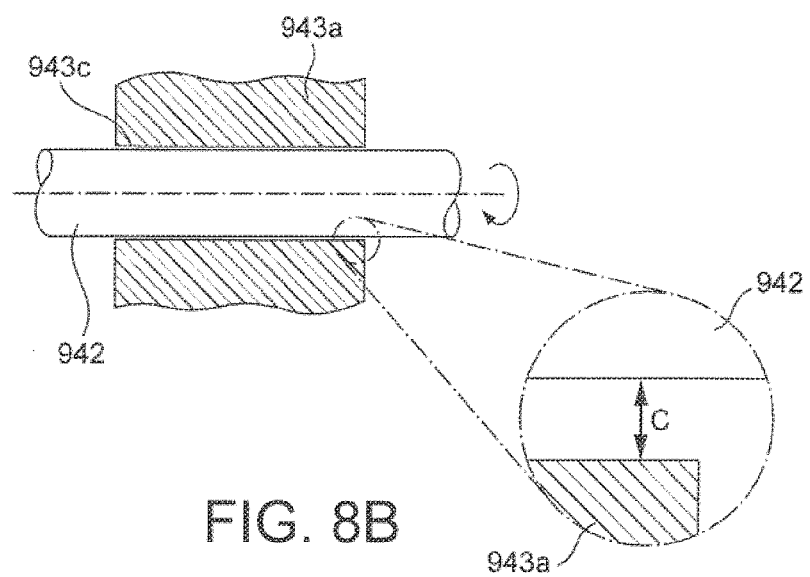
FIG. 8B shows another conventional type of vacuum seal for a rotating shaft.

A known alternative to such mechanical seals is shown in FIG. 8b, in which the seals 943b are absent, and the bore 943c is sized so as to closely fit shaft 942. The clearance between bore and shaft is shown as dimension C on FIG. 8b, and may be, for example, for a bore length of 60 mm and a bore diameter of 20 mm, 20 µm. Such a close fit between shaft 942 and bore 943c inhibits the flow of gas from a high-pressure side (atmosphere) to a low-pressure side (vacuum).

The arrangement of FIG. 8b reduces friction, as no seal elements are in sliding contact with rotating shaft 942, but requires very close tolerances to operate. Further, the exemplary clearance of 20 µm in the conventional seal of FIG. 8b, although inhibiting free flow of gas, still permits some viscous flow of the gas along the length of the bore between the atmospheric side and the vacuum side. The conductance (volume flow rate) through such a seal is on the order of 0.0005 l/s, and hence the mass flow rate from the pressure drop from atmosphere to $10^{-5}$ mbar is 0.5 mbar l/s (1000 mbar×0.0005 l/s).

Therefore, very powerful pumps are needed, capable of removing a mass flow through the seal of 0.5 mbar l/s from a cavity at $10^{-5}$ mbar, i.e. a volume flow rate of $5\times10^4$ l/s, to maintain the vacuum side at a sufficiently high vacuum for operation of the high-voltage generator and the electron beam apparatus.

Reducing the clearance further is technically challenging, and contact between the rotating shaft 942 and the walls of the bore 943c will cause large amounts of frictional heating and damage, and in the case of a large rotary target rotating at high angular velocities, will potentially result in a large transfer of torque to the vacuum housing. Therefore, the embodiment of FIG. 2 advantageously makes use of an improved vacuum seal for a rotating shaft which is able to avoid excessively tight clearances but which is also able to effectively inhibit the flow of gas from the atmospheric side of the bearing to the vacuum side of the bearing.

Figure 9:
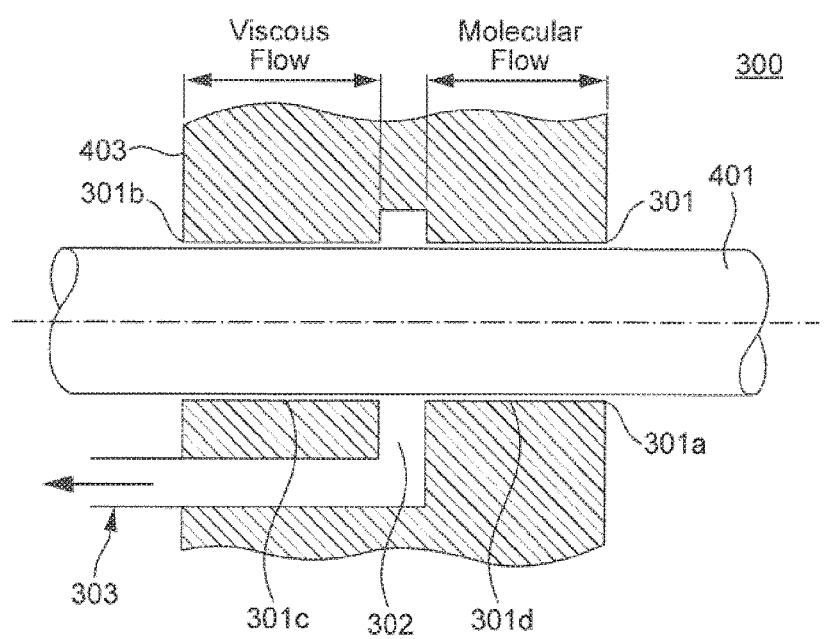
FIG. 9 shows an embodiment of a vacuum seal for a rotating shaft used in the embodiment of FIG. 2.

An embodiment of a non-contact rotary vacuum seal used in the embodiment of FIG. 2 is shown in FIG. 9. The seal has a housing 403 defining a bore 301, through which target drive shaft 401 passes. The bore has terminal apertures at vacuum and atmospheric ends 301a and 301b respectively, and an intermediate chamber 302 provided between the high-pressure end and the low-pressure end. Chamber 302 communicates via a flow path 303 to a pump or a pump port to which a pump may be coupled. In some embodiments, chamber 302 will have a minimum internal dimension across the longitudinal axis of the bore of less than 120% of the minimum internal dimension across the longitudinal axis of the bore itself. However, in some embodiments, the chamber need only be greater in minimum internal diameter relative to the bore by less than 30 times, even less than 20 times, the minimum clearance between the bore and the shaft.

In operation, a backing pump (not shown) is provided to vacuum port 303. This is able to maintain the chamber 302 at a low pressure of around 3 mbar. The clearance between shaft 401 and the wall of bore 301 is comparable to that shown in FIG. 8b, but the presence of intermediate chamber 302 maintained at a lower pressure is able to effectively restrict the total flow of gas through the seal.

Assuming a pressure of about 3 mbar maintained in the chamber, gas flows from the atmospheric side, maintained at approximately 1 bar, under the regime of viscous flow, when the mean free path of the gas molecules is smaller than the clearance between the shaft and the wall of the bore.

As the portion 301c of bore 301 between atmospheric-end terminal aperture 301b and intermediate chamber 302 is, using an exemplary length of 30 mm, about half the length of the bore of FIG. 8b, the viscous-flow conductance is about double that of FIG. 8b, on the order of 0.001 l/s. The mass flow into intermediate chamber 302 from the atmosphere is thus about 1 mbar l/s. At 3 mbar in intermediate chamber 302, this is 0.33 l/s. A small backing pump maintaining a vacuum of 3 mbar in intermediate chamber 302 will generally be able to maintain the 3 mbar pressure in the intermediate chamber 302 by extracting 0.33 l/s.

However, at a pressure of 3 mbar, the mean free path of, for example, nitrogen, the primary constituent of air, at room temperature, is around 20 µm, comparable to the clearance between the bore 301 and the shaft 401. When the mean free path is comparable to or greater than the clearance, the flow of gas molecules between intermediate chamber 302 and high-vacuum terminal aperture 301a of bore 301 along section 301d of bore 301 operates under the molecular flow regime, in which the conductance along section 301d of the bore from the intermediate chamber 302 does not substantially depend on the pressure in the intermediate chamber 302.

Over a length of 30 mm and with a clearance again between shaft 401 and bore 301 of 20 µm, the molecular-flow conductance through section 301d of bore 301 may be estimated to be approximately $10^{-4}$ l/s, or a tenth of that through the section in region 301c of bore 301. The mass flow rate from chamber 302 to high-vacuum terminal aperture 301a through section 301d of the bore 301 is thus approximately $3\times10^{-4}$ mbar l/s. This is a factor of more than $10^3$ smaller than the mass flow through section 301c of the bore 301, and a factor of more than $10^3$ smaller than the flow through the seal of FIG. 8b, due both to the proportion of gas removed from chamber 302 through flow passage 303, and to the operation of section 301d of bore 301 in the molecular, rather than viscous, flow regime.

Accordingly, the arrangement of FIG. 9 is able to provide a more effective vacuum seal than the arrangement of FIG. 8b without incurring the frictional losses involved in providing the seals of FIG. 8a and without reducing the engineering tolerances beyond those required for the arrangement of FIG. 8b.

Although the bore 301 shown in FIG. 9 is substantially cylindrical, as is intermediate chamber 302, this is not essential to the operation of the embodiment of FIG. 9. Particularly, the bore 301 may have other geometries, without limitation, for example having a slight taper. However, a cylindrical bore is used in FIG. 9 since it is easy to manufacture and exhibits a constant clearance with a cylindrical shaft. Furthermore, the portion 301c of the bore connecting the atmospheric aperture 301b with intermediate chamber 302 need not have the same dimensions as the portion 301d of the bore connecting intermediate chamber 302 with the vacuum aperture 301a. However, again, for simplicity of manufacture the embodiment of FIG. 9 maintains these sections of bore to have identical dimensions. Finally, although a cylindrical chamber 302 is advantageous from a point of view of machining, this is not essential.

In some embodiments, the dimensions are selected such that pressure of 1 bar maintained at the high pressure end and a pressure of 1 mbar maintained in the chamber results in a mass flow rate of nitrogen at standard temperature between the high pressure end and the chamber of less than 1 mbar l/s. In some embodiment, the dimensions are selected such that a pressure of 1 mbar maintained in the chamber and a pressure of $10^{-5}$ mbar maintained at the low pressure end results in a mass flow rate of nitrogen between the chamber and the low pressure end of less than $10^{-3}$ mbar l/s.

When put into practice in the embodiment of FIG. 2, a roller bearing is provided at each end of bore 301 to maintain the shaft 401 substantially centred within the bearing. In such a configuration, the arrangement provides an integrated rotary vacuum seal and bearing for a rotating shaft, and any difficulty of aligning external bearings with the seal is eliminated.

Bearing Overtorque Limiter and Kinetic Energy Absorber

In the arrangement of FIG. 9, there remains a possibility that failure of one or other roller bearing could cause the shaft 401 to contact the wall of bore 301. Since shaft 401 is typically driven to a very high speed by motor 144 acting via gearbox 145, in such a situation, the frictional force of the shaft against the wall of the bore 301 could apply a large torque to the vacuum seal and any components of the apparatus connected to it. Alternately, the ingress of contaminants or particulates into the clearance between the shaft 401 and the roller bearing could cause a similar frictional force. In the case of a large-diameter rapidly-rotating target disc such as that shown in FIG. 2, the frictional force resulting could be such as to rapidly heat the shaft 401, and cause the shaft 401 to seize within the roller bearing. The entire energy stored in the rotating target, acting in the manner of a flywheel, would then be transferred via the resulting torque to the bearing housing, incurring the possibility of substantial mechanical damage to the apparatus as a whole and potential risk to an operator.

Figure 10:
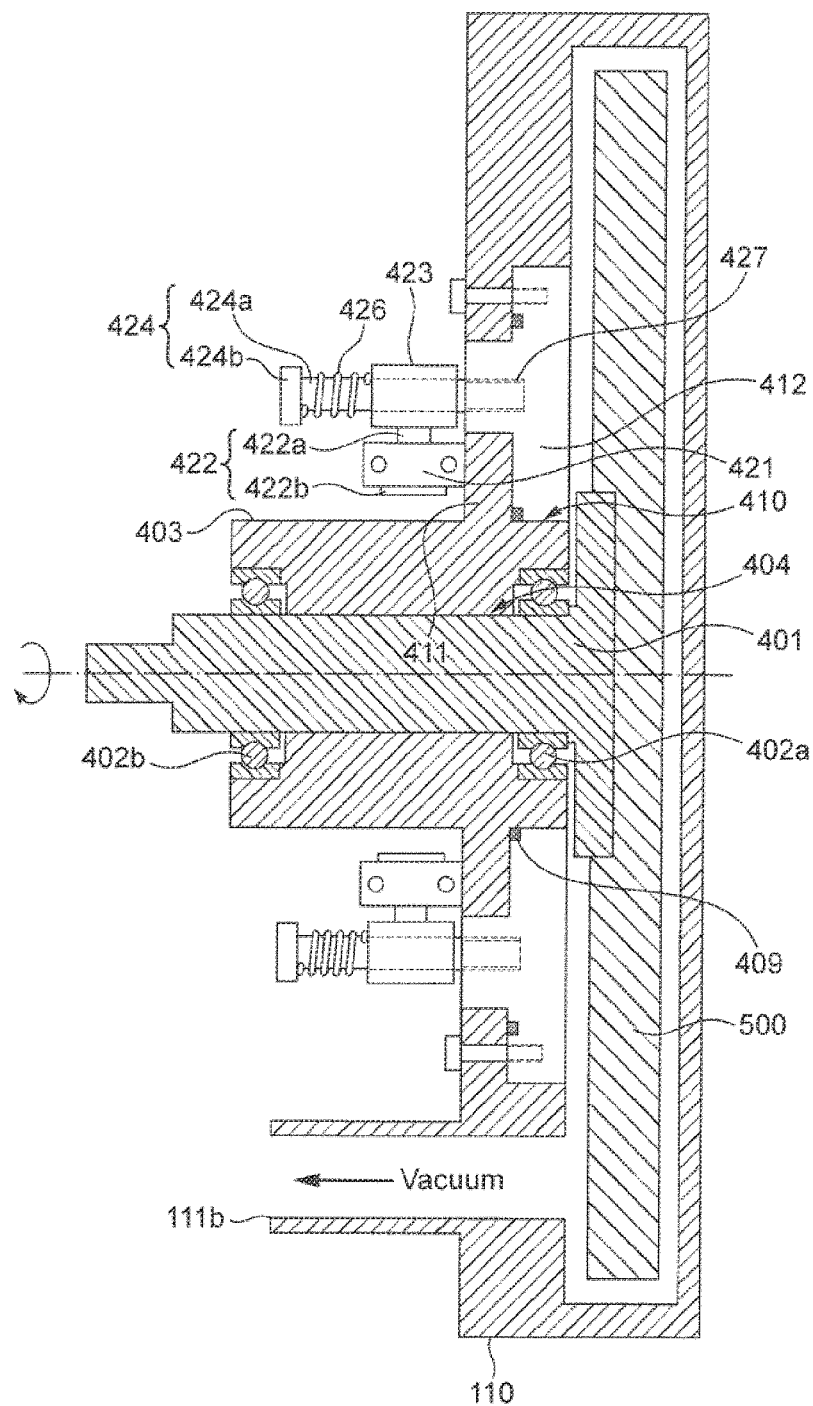
FIG. 10 shows an embodiment of a rotary target assembly suitable for use with the x-ray source shown in FIG. 2.

Therefore, the arrangement of FIG. 2 includes a rotary target assembly of the form shown in detail in FIG. 10, having a torque-limiter to prevent excessive torque being transferred from the bearing housing to the remainder of the apparatus in case of failure, and a kinetic energy absorber to dissipate safely the kinetic energy transferred to the bearing housing. In FIG. 2, these functional elements are provided through common aspects of target assembly 400 shown in FIG. 10.

In the target assembly shown in FIG. 10, a rotary x-ray target 500 is mounted on drive shaft 401, which shaft 401 passes through the wall of vacuum enclosure 110 and is supported by roller bearings 402a and 402b mounted in bearing housing 403. Bearing housing 403 is removably mounted to the wall of vacuum enclosure 110 and seals against it by means of seal 409, thus forming part of vacuum enclosure 110. Rotation of shaft 401 drives target 500 in rotation.

In the embodiment of FIG. 2, the flow of gas through bore 404 in bearing housing 403, through which shaft 401 passes, is inhibited by employing the rotary vacuum seal described in relation to FIG. 9. The details of the seal are, however, not important for the operation of the torque limiting functionality and the kinetic energy absorbing functionality.

In FIG. 10, bearing housing 403 is generally cylindrical in external profile, and has a flange 411 extending radially from an outer radial surface of bearing housing 403. Flange 411 is annular, and is in sliding contact with a corresponding annular plate 412 of vacuum enclosure 110, such that the bearing assembly 403 is able to rotate around the axis defined by its bore 404 relative to the remainder of vacuum enclosure 110 with a surface of flange 411 in sliding frictional contact with plate 412. Outer circumference of bearing housing 403 is rotatably inserted into a corresponding circular aperture 410 formed in the wall of vacuum enclosure 110, which together provide a vacuum seal by means of annular seal element 409.

A clamp 420 is provided to urge the flange 411 and the plate 412 into sliding frictional contact. Clamp 420 comprises roller bearing 421 rotatably mounted on shaft 422a of arm 422 and is retained by end cap 422b. Roller bearing 421 is mounted so as to rotate about an axis which is a radius of bore 404. Roller bearing 421 is urged axially relative to bore 404 by spring 426, which applies axial force to collar 423 on which roller bearing 421 is mounted via arm 422.

Collar 423 is arranged to slide axially on shaft 424a of adjusting screw 424, which is itself retained within threaded bore 427 of housing 110, in such a way that rotation of cap 424b of adjusting screw 424 adjusts the distance between cap 424b and collar 423, thus adjusting the compression of spring 426 interposed between cap 424b and collar 423 and thereby adjusting the force applied between cap 424b and collar 423. Thus, the force applied via roller bearing 421 between flange 411 and plate 412 may easily be adjusted.

In FIG. 10, two instances of the clamp are provided diametrically opposite one another on either side of the bearing housing 403 to provide urging force on either side of the bearing; this is, of course, exemplary, and a greater or lesser number of clamps 420 may be provided and spaced circumferentially about the axis of bore 404. Preferably, three or more such clamps, in equiangular spacing, are provided.

In operation, the compressive clamping force provided between flange 411 and annular plate 412 is sufficiently large that the frictional force between flange 411 and plate 412 inhibits rotation of the bearing housing 403 relative to vacuum enclosure 110. However, if the shaft 401 should seize relative to bearing housing 403, for example through failure of one of the roller bearings 402a or 402b, through failure of a vacuum seal, or through contamination of bore 404 or displacement of shaft 401 relative to bore 404 such that shaft 401 seizes in bore 404, the torque transferred from rotating target 500 via shaft 401 to bearing housing 403 will be sufficient to overcome the static friction between flange 411 and plate 412 and thus the bearing assembly 403 will rotate as a whole relative to vacuum enclosure 110 and the remainder of the apparatus.

Although some torque will be transmitted via the sliding contact between flange 411 and plate 412 to vacuum enclosure 110, this transmitted torque is substantially less than to the total torque which would have been applied to the vacuum enclosure 110 from target 500 due to the failure of the bearings or the sticking of the shaft. Therefore, since less torque is transferred to the vacuum enclosure, there is less possibility of damage to the apparatus and less risk to the operator.

The difference in the torque transferred is as a consequence of the work done by the flange 411 sliding against plate 412. The work done generates heat. Therefore, not only does the arrangement of clamp 420, flange 411, and plate 412 act as a torque limiter to inhibit excessive torque being transferred to vacuum enclosure 110, it also enables the flywheel energy stored in rotating target 500 to be relatively slowly dissipated as heat through frictional contact between flange 411 and plate 412. In contrast, since clamp 420 applies clamping force to flange 411 via roller bearing 421, there is little energy dissipated in clamp 420.

In the embodiment of FIG. 10, the plate 412 is selected to be a material which, at operating temperatures of less than 100° C., will be non-galling when under compressive contact with flange 411. Therefore, the possibility of adhesion over time between flange 411 and plate 412 is reduced, and the mechanism can be relied upon to operate under the design conditions. Particularly, when vacuum enclosure 110 is stainless steel, the plate 412 may be made of brass.

Of course, the arrangement of FIG. 10 is only one embodiment of a torque-limiting and/or kinetic energy dissipating rotary target assembly. For example, in order to provide the torque-limiting feature alone, a bearing housing could be provided which is mounted to the wall of vacuum enclosure 110 by means of shear pins which are adapted to shear under a predetermined torque transfer to the bearing. Once a torque threshold had been exceeded, and the shearing of the shear pins had occurred, the bearing would then simply freely rotate relative to the remainder of the apparatus.

Such arrangements do not, however, control or limit the rate at which the kinetic energy in the target 500 is dissipated after operation of the torque-limiter, and unacceptable thermal or mechanical stress to the vacuum enclosure 110 may occur. To address such concerns, an additional or alternative means of dissipating the kinetic energy transferred from the rotating target 500 may be desired. For example, the bearing could be provided with fins projecting into a surrounding tank of viscous fluid, such as an oil, and within which the bearing with fins could rotate. Kinetic energy would thus be dissipated through interaction of the fins with the oil. Other possible approaches to dissipating the kinetic energy are possible, as one skilled in the art will understand.

However, the arrangement of FIG. 10 provides a particularly effective and efficient solution to the problem of excessive torque transfer in rotating target assemblies.

In one particular embodiment of the arrangement of FIG. 10, a 400 mm diameter target rotating at 1200 rpm, having a main mass of 8 kg, may have a kinetic energy of around 130,000 J. Assuming that, on seizure, the bearing housing is accelerated to the speed of the target in ten revolutions of the target, a torque of around 2,000 Nm could be generated. However, in the arrangement of FIG. 10, if the adjusting screws 424b are adjusted to provide about 80 kg of force between flange 411 and plate 412, and assuming the flange has a diameter of about 80 mm, and also assuming a coefficient of friction between flange 411 and plate 412 of 0.25, the energy in the target will totally dissipate between 20 and 30 seconds, generating a peak thermal power of 10 kW of heat and transferring a peak torque to vacuum enclosure 110 of only about 8 Nm. However, the arrangement of FIG. 10 is applicable to other target speeds, masses, and any maximum torque that may be required, by appropriate adjustment of adjusting screw 424b. For example, a suitable force might be 50 kg, in certain circumstances.

Notably, several variants are possible on the arrangement of FIG. 10. For example, in some cases, it may be desired that adjusting screws 424b are not provided, and instead a predetermined and fixed force is applied, in order to avoid inadvertent or incorrect adjustment of the torque-limiter. In some embodiments, a clamp force of 50 kg may be sufficient, or even less, and the maximum continuous or instantaneous torque permitted to be transferred may be 10 Nm or less.

In the embodiment of FIG. 10, bearing housing 403 is generally cylindrical, and inserts into a corresponding cylindrical aperture 410 in the wall of vacuum enclosure 110; however, this is not essential, and contact between a non-cylindrical bearing housing and the wall of the vacuum enclosure could be provided only through the clamping of the flange to the plate. Preferably, though, an aperture to accommodate the bearing aperture is formed in the energy-absorbing plate 412, so that any frictional contact between the outer cylindrical wall of the bearing and the aperture dissipates frictionally-generated energy in a controlled manner.

The energy-absorbing plate 412 may be provided to the bearing housing, and the flange 411 may be provided to the exterior wall of the vacuum enclosure 110. Either the kinetic energy absorbing plate or the flange may be intermittent, that is, may be formed with radial gaps, such that at least a portion of the flange or the energy-absorbing plate might be formed as radially-protruding veins. However, a continuous flange and continuous energy-absorbing plate maximises the frictional contact between the two components and also provides greater thermal mass into which to dissipate the generated heat. The flange itself need not be present, and sliding contact could simply be provided between an end face of the bearing housing and a surface of an exterior wall of the vacuum enclosure.

The annular energy-absorbing plate and the flange may be formed integrally with the bearing housing or the wall of the vacuum enclosure 110, or may be provided, as shown in FIG. 10, as a distinct component, for example having a composition different from that of the remainder of the bearing housing and/or the vacuum enclosure. Such is advantageous to allow the properties of the energy-absorbing plate to be selected to control the static and sliding friction between flange and plate and to optimise the kinetic energy dissipation in the plate.

Rotary X-Ray Transmission Target

The arrangement of FIG. 2 employs a rotating transmission target 500 to generate x-rays from the incident electron beam. Conventionally, rotary targets for x-ray emission sources are formed as a disc on which a layer of suitable high-atomic-number target material, such as tungsten, is plated. For a transmission target, in which the electron beam is applied from one side and the x-ray emission is taken from the opposite side, the substrate supporting the target should be both thin and lower in atomic number to minimise x-ray absorption, and must have geometry, mechanical properties and physical properties such as thermal conductivity, specific heat capacity and melting point to dissipate the heat generated by the x-ray irradiation. However, these requirements can come into conflict.

For electron beam energies of around 160 keV, a thin layer of tungsten, for example about 10 μm, may be deposited onto a beryllium, carbon or aluminium substrate. However, as the electron beam energy increases, the penetration of the electrons into the target increases and a thicker layer of target material is required. For example, 750 keV electron beams can penetrate in excess of 200 μm into tungsten. However, it is difficult to deposit thin layers of such target materials onto the lower-atomic-number substrates needed, due to bonding stresses at the interface. Further, during sustained operation at elevated temperatures and under rotation at high speeds, the bonding stresses can increase and cause failure or delamination of the target material. Relatively thick targets are not an option in transmission mode, as they will tend to absorb the x-rays generated.

One solution to this problem is to mechanically attach an annulus of suitable target material to a hub. This approach is suitable for low electron fluxes, but as higher electron fluxes are deposited in the target, the target must rotate faster and must have a larger diameter to avoid excessive thermal stress in the target ring. When such arrangements are subject to the thermal stress of high electron beam flux and fast rotation, the hoop stress due to the centripetal forces, the thermal stress due to the incident electron beam, and the tensile stress between the target annulus and the hub can lead to fracture in the target material. Where fracture occurs, a gap may form in the target ring, and the electron beam is then able to pass through the low-density hub and irradiate the x-ray emission window, leading to potential damage to the window.

To solve these problems, the embodiment of FIG. 2 employs a target in which a plurality of target plates are anchored on a hub to provide an annular target region about the axis of the hub. By providing a plurality of separate target plates, rather than a continuous ring of target material, local stresses introduced in each plate do not transfer to other regions of target material, and the plates are locally able to contract and expand under the thermal stress without the possibility of the ring fracturing at a single weak point. Furthermore, the hoop stress induced in the target region does not lead to failure of the target plates since the target plates are discontinuous and can individually distort to accommodate stresses without affecting neighbouring regions of target material.

FIGS. 11a, 11b, 12a and 12b depict a rotary x-ray emission target suitable for use in the embodiment of FIG. 2.

Figure 12A:
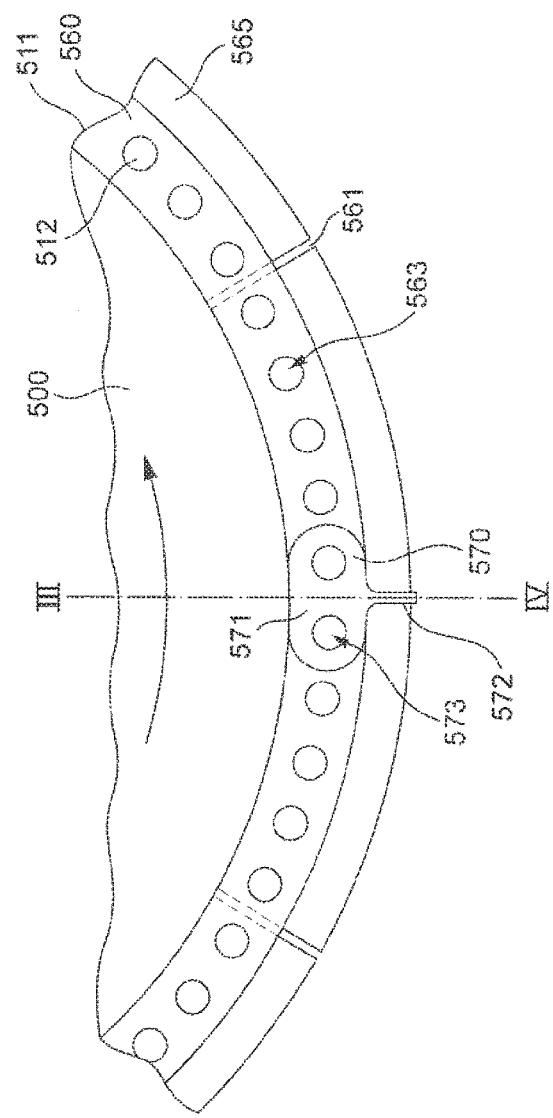
FIG. 12A shows a portion of an embodiment of a rotary target assembly suitable for use in the embodiment of FIG. 2.

In FIG. 12a, target plates 560 in the form of annular sectors are anchored to an outer periphery 511 of target hub 500 to form a substantially annular target region. In the arrangement of FIG. 12a, target plates 560 are clamped to hub 500 at a relatively radially inward position of each plate, and have target portions 565 which project relatively radially outward of this position relative to hub 500 into the target region. However, provided the hub material is sufficiently thin to allow transmission of the x-rays, the plates can be arranged to lie within the outer periphery of the hub, as may be required.

In some embodiments, the target plates can have target plates, in the target region, have a thickness less than 200% of the electron penetration depth in the target material at 750 keV, preferably less than 150%, more preferably less than 125%. Selecting such thicknesses allows the x-ray attenuation by the target material to be reduced.

Advantageously, in the arrangement of FIG. 12a, target plates 560 are separated by gaps 561 which interrupt the target material of the target region. In FIG. 12a, gaps 561 are provided extending in a radial direction between target plates 560, but can be provided at some other angle to the radial direction, without limitation. The gaps also have no particular limitation on their size, other than being sufficiently small such that when the target disc is operated at an operational rotational speed, the target plates present a substantially continuous target surface to the incident electron beam. For example, the interruptions in the target material can represent no more than 10%, no more than 1%, no more than 0.1%, or no more than 0.05% of a total circumferential path within the target region. Therefore, with plates of circumferential length 50 mm, gaps of circumferential length between 0.1 mm and 0.2 mm between neighbouring plates may be appropriate.

Alternatively, the plates can abut or partially overlap, so as to permit the edge of one plate to slide under an adjacent plate. In such a situation, it may be advantageous to form the plates to have bevelled circumferential-direction edges to allow the plates to abut with an overlap.

While such a structure serves to effectively reduce the total stresses induced in the target material and thus to guard against failure, under particularly high beam fluxes or energies, the edges of the plates 560 themselves may be prone to failure. Particularly, when the electron beam irradiates an edge region of a plate 560, the possibility of thermal dissipation of the heat is greatly reduced as compared with irradiation in the centre of a plate, since the generated heat can only flow in one circumferential direction, rather than in both directions. Therefore, under particularly intense irradiation, such edge regions may be prone to damage.

Figure 12B:
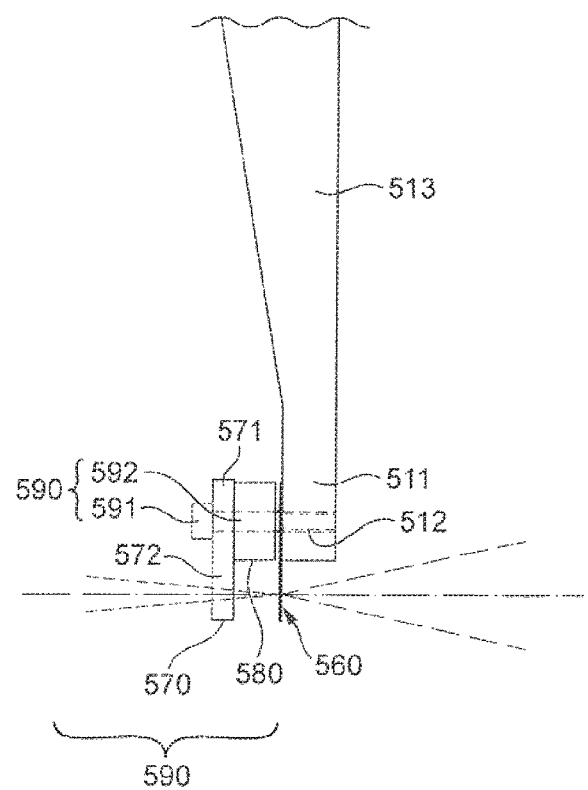
FIG. 12B shows a transverse section along the line III-IV in FIG. 12A.

To prevent such damage, the arrangement shown in FIGS. 12a and 12b is adopted, wherein shield elements 570 are provided to axially overlie the edge portions of adjacent target plates 560 so as to interrupt the electron beam when these regions intersect the beam path. Each shield element 570 is formed of a material which interrupts the electron beam but which is not as efficient at producing x-rays as the target material, and which preferentially produces heat. For example, a material of lower atomic number may be used as the shield material, with a thickness chosen so as to fully or partially absorb the electron beam. Beryllium or aluminium are, among others, suitable materials, since their low atomic numbers avoid the creation of a competing unwanted secondary x-ray source in the shield elements 570.

In the arrangement of FIGS. 12a and 12b, shield elements 570 comprise fingers 572 extending above the circumferential-direction edge portions of shield elements 560. Since each finger 572 is axially displaced relative to the respective target plates 560, the edges of which it overlies, finger 572 is relatively defocussed from the focal plane of the electron beam at the underlying target plates 560 and thus the thermal power density deposited in finger 572 is lower, and thus more easily dissipated, due to the larger electron beam spot size. In particular, as shown in FIG. 12b, a spacer 580 is provided between target plate 560 and shield element 570 to provide the required displacement.

For example, using a magnetic lens which focusses a 1 mm diameter beam to a 10 μm diameter spot over a focal length of 30 mm, if the finger is spaced 6 mm from the target plate then the beam diameter at the finger will be about 200 μm. In such a situation, the instantaneous power per unit area deposited in the finger will only be around one twentieth that deposited in the target, and may be more easily dissipated.

In the arrangement of FIGS. 12a and 12b, both shield elements 570 and plates 560 are clamped to hub 500 by means of clamp screws 590 engaged with threaded bores 512 formed in the hub circumferential portion 511 of hub 500, which clamp screws 590 pass through and provide axial clamping force to target plates 560 and shield elements 570 but which also permit slight expansion and contraction of each of these elements under the thermal and kinetic forces existing during operation. To enable clamp screws 590 to pass through target plates 560, bores 563 are provided in the target plates, while to enable clamp screws 590 to pass through shield elements 570, bores 573 are provided in the shield elements.

Advantageously, each shield element 570 has, in addition to the projecting finger portion 572, a relatively circumferentially broader and axially deeper mount portion 571 having bores 573, providing a secure anchor point through which shafts 592 of clamp screws 590 can pass and against which caps 591 of clamp screws 590 can apply clamping force, and providing a thermal mass for absorbing the heat generated in shield element 570 as it passes through the electron beam.

Although the arrangements of FIGS. 12a and 12b effectively prevent damage to the target material as a result of instantaneous thermal and mechanical stresses during operation, it is useful to reliably further dissipate the heat generated in the target region away from the peripheral edge of the target. The design of hub shown in FIGS. 11a and 11b is able to achieve this.

Figure 11A:
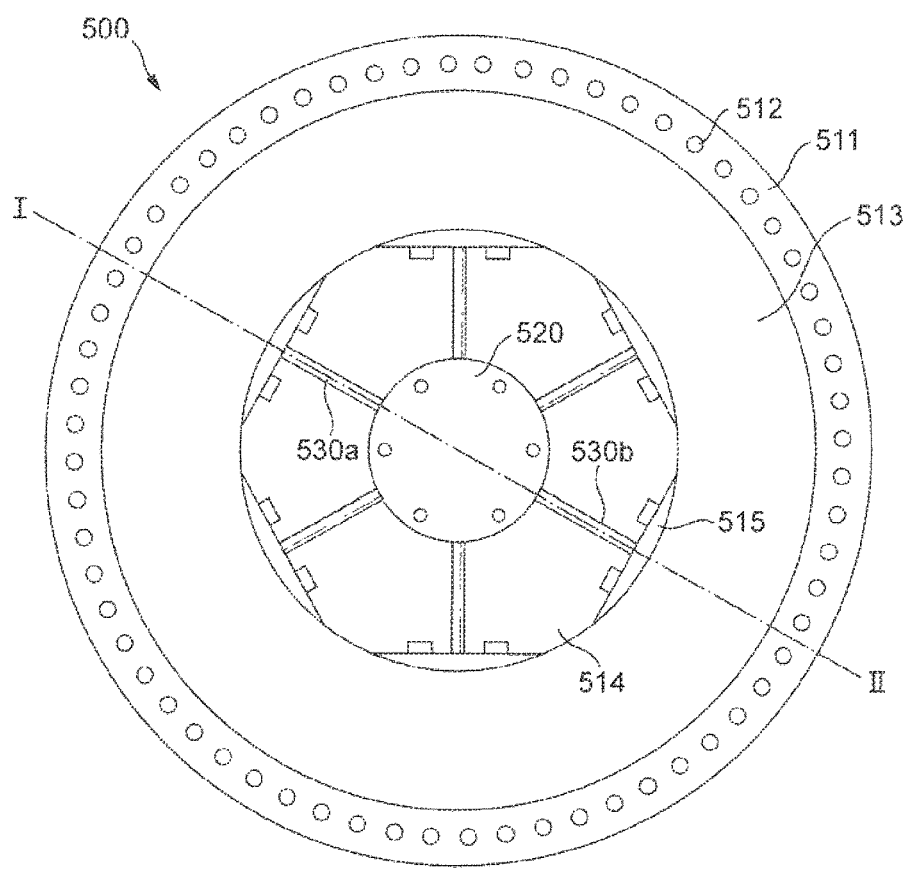
FIG. 11A shows a hub for supporting target plates to form an embodiment of a rotary x-ray emission target for use in the embodiment of FIG. 2.

Hub 500 shown in FIG. 11a has a peripheral edge portion 511 having a flat beam-facing surface for accommodating plates 560 of target material, and has an intermediate annular portion 513, radially inward of peripheral portion 511, having an increased thickness and accommodating cooling passages 515, shown in the cross-section view of FIG. 11b. The intermediate annular portion 513 allows the absorption and transfer of heat from the peripheral edge portion 511. Cooling passages 515 extend in a branched fashion throughout intermediate annular portion 513 and serve to carry a cooling fluid which conducts heat from intermediate annular portion 513, to which heat is conducted from the peripheral edge portion 511.

To allow cooling fluid to be conveniently supplied to and withdrawn from cooling passages 515, a boss portion 520 is provided to the hub 500 to project axially from within a central recess 514, which recess is formed in a face of the hub 500 radially inward of intermediate annular portion 513. In FIG. 11a, the boss 520, like hub 500, is disc-shaped in geometry. Boss 520 provides supply and return apertures 521a, 521b at an outer circumferential surface of the hub and directed towards an inner circumferential surface of the recess 514, in which corresponding apertures 515a, 515b are formed. Supply and return pipes 530a and 530b extend between apertures 521a, 521b in the hub and apertures 515a and 515b in the wall of the recess.

Apertures 515a and 515b in the wall of the recess communicate with flow passage 515, providing respective supply and return ports for fluid flowing in passage 515. Ports 521a and 521b respectively provide supply and return ports for fluid flowing from and returning to hub 520.

Internal to hub 520 are supply passage 521, communicating with supply ports 521a, and return passage 522, communicating with return ports 521b. Supply and return passages 521, 522 which terminate inside boss 520 at coaxially arranged flow passages arranged to match coaxially-arranged supply and return passages 401c, 401d in shaft 401. Shaft 401 mounts to hub via shaft boss 401b, which is clamped to a face of hub 500 opposite to the boss 520 by screws which penetrate the boss 520 and the hub 500 and which terminate in threaded bores in shaft boss 401b. Of course, other methods of mounting hub 500 on shaft 401b are possible, such as splines and screw threads, as well as other arrangements of supply and return passages.

Coolant supplied through central supply passage 401c in shaft 401 passes into supply channel 521 in boss 520 and, via apertures 521a, pipes 530a, and apertures 515a in order, then passes into coolant flow path 515. Coolant returned from flow path 515 passes through apertures 515b, pipes 530b, and apertures 521b in order, into coolant return passage 522 in boss 520, and then returns along outer coaxial flow path 401d in shaft 401.

Pipes 530 are maintained in position by seal elements 521a and 521b, which are fixed, in the present embodiment by screws, to the inner circumferential surface of recess 514. The pipes may be rigid or flexible, and may extend along radii of hub 500 or along other paths between the boss 520 and the flow path 515

Accordingly, the arrangement of FIGS. 11a and 11b enable the peripheral portion of a target hub to be efficiently cooled by a coolant fluid supplied to and retrieved from the shaft about which the hub rotates.

In an alternative configuration, the boss 520 could be fully or partly recessed into the surface of hub 500. In some configurations, the surface of hub 500 at which boss 520 is provided is flat as a consequence of the recessing of the boss. In such configuration, pipes 530 may be omitted, and apertures 521a and 515a, as well as apertures 515b and 521b, could be provided to seal against one another, optionally with respective seal members. Alternatively, the apertures 521a and 521b or the apertures 515a and 515b could be located in an axial surface of the hub 500 or boss 510 and connected by pipes having angular or curved paths. Such a configuration could be provided with a fully, partly or unrecessed boss, and with such a configuration, the central recess 514 could be omitted or could be provided as the recess into which a fully or partly recessed boss is fitted. All such variations are within the scope of the present disclosure.

Of course, the various elements of the apparatus of FIG. 2 may be provided separately or together, and such variations would be understood by one skilled in the art taking into account the technical effects provided by each of the elements disclosed herein. According to available materials and techniques, and according to the engineering and other requirements of any realised device, elements may be replaced, substituted, removed or modified without departing from the disclosure, spirit and scope of the invention as described herein.

The invention claimed is:

1. A rotary x-ray emission target for generating x-ray radiation under electron beam irradiation, comprising:
   a support hub defining a predetermined axis of rotation of the target, and
   a plurality of target plates, each comprising target material, supported on the hub, wherein the plates are arranged on the hub to provide an annular target region about the axis of rotation, wherein:
   the hub has a first radially inner region of reduced thickness and a second radially outward region of increased thickness;
   the second region is provided with a plurality of radially-extending passages for cooling fluid;
   the reduced thickness of the first region defines a recess in an axial face of the hub; and
   the plurality of passages terminate in corresponding ports provided in a circumferential wall of the recess.

2. The target of claim 1, wherein the target plates are arranged spaced apart from one another in a circumferential direction of the target region such that the target material of the target region is interrupted between the target plates.

3. The target of claim 2, wherein the interruption of the target material in the target material represents no more than 10% of a total circumferential path within the target region.

4. The target of claim 1, wherein the target plates abut one another or overlap to provide a substantially continuous target region of target material.

5. The target of claim 1, wherein each of the target plates are anchored to the hub at a radially inward position of the plate and project radially outwardly of the hub.

6. The target of claim 1, wherein each of the target plates is in the form of annular sectors.

7. The target of claim 1, further comprising a plurality of shield elements supported on the hub and arranged to overlie portions of the target region at which target plates abut or overlap, or at which target material is absent.

8. The target of claim 7, wherein the shield elements are arranged to overlie circumferential-direction edge portions of the target plates.

9. The target of claim 8, wherein the shield elements are axially spaced from the target plates at a position within the target region.

10. The target of claim 1, wherein the target plates, in the target region, have a thickness less than 200% of the electron penetration depth in the target material at 750 keV.

11. The target of claim 1, wherein the hub has mounting means for mounting the hub to a bearing for rotation about the axis of rotation.

12. The target of claim 1, wherein the plurality of passages are so connected as to define at least one continuous flow path extending from and returning to the wall of the recess.

13. The target of claim 12 wherein the hub comprises a coolant distributor located in the recess and comprising:

a coolant inlet port and a coolant outlet port;
a supply path for coolant supplied to the inlet port to the at least one continuous flow path; and
a return path for coolant returned from the at least one continuous flow path to the at least one outlet port.

14. The target of claim 13, wherein the coolant distributor comprises a central boss provided in the recess having the at least one inlet port and at least one outlet port and, optionally, a plurality of pipes extending from the boss to the ports provided in the circumferential wall of the recess, the central boss having internal passages arranged to distribute coolant, optionally via the plurality of pipes, from the inlet port to the at least one continuous flow path and from the at least one continuous flow path to the outlet port.

15. An x-ray gun comprising:
an electron beam generator and an x-ray emission target according to claim 1 rotatably positioned such that electrons from the electron beam generator irradiate a portion of the annular target region while the target rotates.

16. The target of claim 2, wherein the interruption of the target material in the target material represents no more than 1% of a total circumferential path within the target region.

17. The target of claim 2, wherein the interruption of the target material in the target material represents no more than 0.1% of a total circumferential path within the target region.

18. The target of claim 1, wherein the target plates, in the target region, have a thickness less than 150% of the electron penetration depth in the target material at 750 keV.

19. The target of claim 1, wherein the target plates, in the target region, have a thickness less than 125% of the electron penetration depth in the target material at 750 keV.

* * * * *